United States Patent
Di Vincenzo et al.

(10) Patent No.: US 10,529,410 B2
(45) Date of Patent: Jan. 7, 2020

(54) TECHNIQUES FOR ACCESSING AN ARRAY OF MEMORY CELLS TO REDUCE PARASITIC COUPLING

(71) Applicant: Micron Technology, Inc., Boise, ID (US)

(72) Inventors: Umberto Di Vincenzo, Capriate San Gervasio (IT); Lucia Di Martino, Monza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/845,619

(22) Filed: Dec. 18, 2017

(65) Prior Publication Data
US 2019/0189190 A1 Jun. 20, 2019

(51) Int. Cl.
*G11C 11/4091* (2006.01)
*G11C 11/4074* (2006.01)

(52) U.S. Cl.
CPC ...... *G11C 11/4091* (2013.01); *G11C 11/4074* (2013.01)

(58) Field of Classification Search
CPC . G11C 11/4091; G11C 11/22; G11C 11/2273; G11C 11/221
USPC .......................................................... 365/145
See application file for complete search history.

(56) References Cited

U.S. PATENT DOCUMENTS

| 5,831,895 | A | * | 11/1998 | Manning | ................... G11C 7/06 365/149 |
| 9,613,676 | B1 | | 4/2017 | Wang et al. | |
| 9,761,312 | B1 | * | 9/2017 | Kajigaya | ............ G11C 14/0027 |
| 2006/0056225 | A1 | * | 3/2006 | Hashimoto | ............. G11C 11/22 365/145 |
| 2009/0168490 | A1 | | 7/2009 | Madan | |
| 2014/0239512 | A1 | | 8/2014 | Pellizzer et al. | |
| 2017/0263304 | A1 | * | 9/2017 | Vimercati | ............... G11C 11/22 |
| 2017/0352397 | A1 | * | 12/2017 | Guo | ...................... G11C 11/221 |

OTHER PUBLICATIONS

IPO, "Office Action," issued in connection with ROC (Taiwan) Patent Application No. 107115661, dated Mar. 4, 2019 (5 pages).

* cited by examiner

*Primary Examiner* — Alfredo Bermudez Lozada
(74) *Attorney, Agent, or Firm* — Holland & Hart LLP

(57) ABSTRACT

Techniques are described herein for mitigating parasitic signals induced by state transitions during an access operation of a selected memory cell in a memory device. Some memory devices may include a plate that is coupled with memory cells associated with a plurality of digit lines and/or a plurality of word lines. Because the plate is coupled with a plurality of digit lines and/or word lines, unintended coupling between various components of the memory device may occur during an access operation. To mitigate parasitic signals induced by the unintended coupling, the memory device may isolate the selected memory cell from a selected digit line during certain portions of the access operation. The memory device may isolate the selected memory cell when the plate transitions from a first voltage to a second, when the selected digit line transitions from a third voltage to a fourth voltage, or a combination thereof.

25 Claims, 13 Drawing Sheets

TECHNIQUES FOR ACCESSING AN ARRAY OF MEMORY CELLS TO REDUCE PARASITIC COUPLING

BACKGROUND

The following relates generally to memory devices having a single plate coupled with a plurality of digit lines and more specifically to techniques for accessing an array of memory cells having such a configuration.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Some memory devices may include a plurality of digit lines and a plate line coupled with each of the plurality of digit lines. In such implementations, one or more plate drivers may be needed for each plate line. Accommodating the numerous plate drivers may require inefficient use of die space, unnecessarily elevated power requirements and consumption, and other problems. Some memory devices may include a plate that is coupled with memory cells associated with a plurality of digit lines and/or a plurality of word lines. With such a plate configuration, the memory device may be configured to use fewer plate drivers than other architectures. The reduction in the number of plate drivers may increase the efficient use of die space, may reduce power consumption, and may yield other advantages. Such a plate configuration, however, may also introduce a number of issues not present in other architectures. For example, because the plate is coupled with a plurality of digit lines and/or word lines, unintended coupling between various components (e.g., memory cells, digit lines, word lines) may occur during an access operation. In some cases, when the plate or a digit line transitions from a first voltage to a second voltage, parasitic signals may be induced on other memory cells, digit lines, and/or word lines. Such parasitic signals may "disturb" the logic states stored on unselected memory cells and may cause errors to be introduced into the data either through changing the states stored on memory cells or introducing errors into access operations.

Techniques are described herein for mitigating parasitic signals induced by state transitions during an access operation in a memory device that includes a plate coupled with a plurality of digit lines and/or a plurality of word lines (either directly or indirectly). To reduce or mitigate parasitic signals induced by unintended coupling, the memory device may isolate a selected memory cell from a selected digit line during one or more portions of an access operation. For example, the memory device may isolate the selected memory cell when the plate transitions from a first voltage to a second voltage, when the selected digit line transitions from a third voltage to a fourth voltage, or a combination thereof.

Features of the disclosure introduced above are further described below in the context of FIGS. 1-3. Specific examples are then described with reference to FIGS. 4-6. These and other features of the disclosure are further illustrated by and described with reference to apparatus diagrams, system diagrams, and flowcharts that relate to techniques for accessing an array of memory cells.

Figure 1:
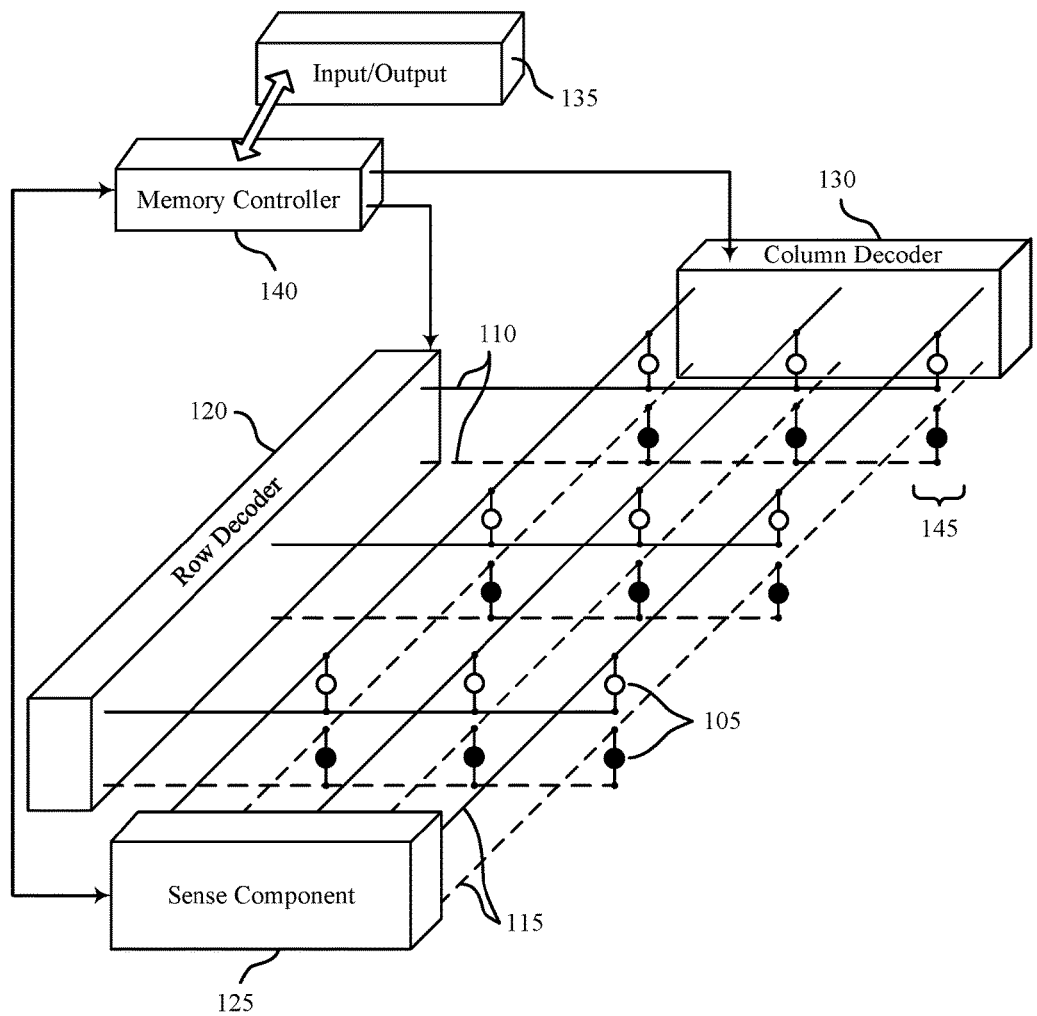
FIG. 1 illustrates an example of a memory array that supports techniques for accessing an array of memory cells in accordance with embodiments of the present disclosure.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145. In some cases, the memory array 100 may be referred to as a memory device 100.

Each row of memory cells 105 is connected to an access line 110, and each column of memory cells 105 is connected to a bit line 115. Access lines 110 and bit lines 115 may be substantially perpendicular to one another to create an array. In addition, each row of memory cells 105 may be coupled to at least in one plate line (not shown). As used herein, the terms plate node, plate line, or simply plate may be used interchangeably. As shown in FIG. 1, each memory cell 105 in a memory cell stack 145 may be coupled to separate conductive lines such as bit lines 115. In other examples (not shown), two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third deck may share an access line 110 with a lower deck. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting access line 110 and digit line 115. Access lines 110 may also be known as word lines 110, and bit lines 115 may also be known digit lines 115. In some examples, the term access line may refer to word lines, bit lines, digit lines, or plate lines. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Upon selecting a memory cell 105, the resulting signal may be used to determine the stored logic state.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, and multiple digit lines 115. Thus, by activating a word line 110 and a digit line 115, the memory cell 105 at their intersection may be accessed. As is described in more detail below, by coupling a single plate to multiple lines (e.g., rows or columns) of memory cells, the access operations to the memory cells may be modified. For example, during an idle period the plate line and the digit line of a memory cell may be maintained at a non-zero voltage. In another example, during an access operation, digit lines coupled to unselected memory cells may be selectively coupled to the plate to mitigate unwanted transient voltages.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. Exemplary access operations for ferroelectric memory cells are described below with reference to FIGS. 2 and 3.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. As described in more detail below, unselected memory cells may be shunted to the plate to mitigate unwanted transient voltages.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. But in non-volatile memory, such as an array that employs ferroelectrics, accessing the memory cell 105 may not destroy the logic state and, thus, the memory cell 105 may not require re-writing after accessing. In some examples, multiple levels of memory cells may be coupled to the same plate. Such a plate configuration may result in a smaller amount of area used to connect higher levels memory cells to the substrate.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
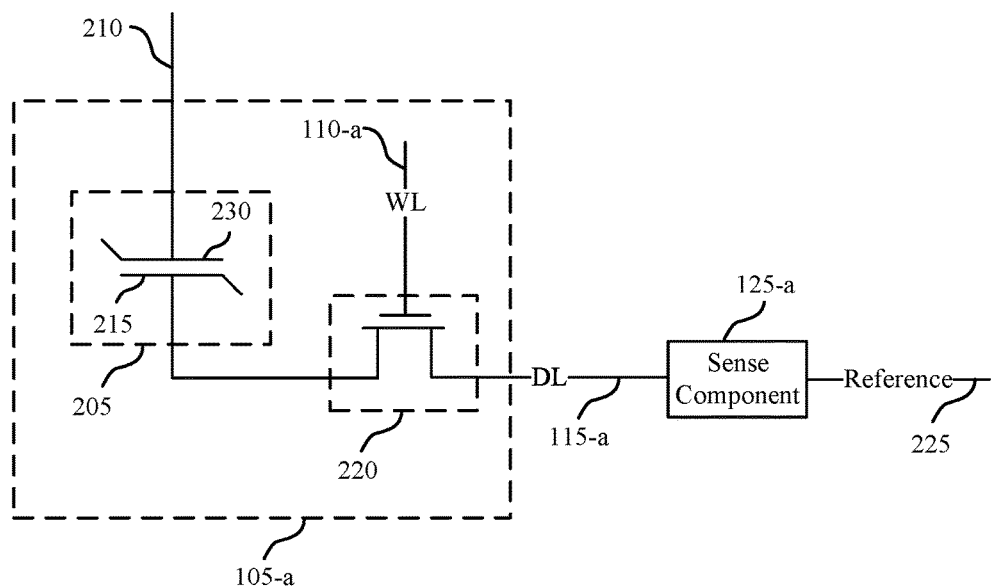
FIG. 2 illustrates an example of a circuit that supports techniques for accessing an array of memory cells in accordance with embodiments of the present disclosure.

FIG. 2 illustrates an example circuit 200 in accordance with various embodiments of the present disclosure. Circuit 200 includes a memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-*a*. Circuit 200 also includes selection component 220 and reference line 225. Cell plate 230 may be accessed via plate line 210 and cell bottom 215 may be accessed via digit line 115-*a*. In some cases, some memory cells 105-*a* may share access lines (e.g., digit lines, word lines, plate lines) with other memory cells. For example, a digit line 115-*a* may be shared with memory cells 105-*a* in a same column, a word line 110-*a* may be shared with memory cells 105-*a* in the same row, and a plate line 210 may be shared with memory cells 105-*a* in the same section, tile, deck, or even multiple decks. As described above, various states may be stored by charging or discharging the capacitor 205. In many examples, a connector or socket may be used to couple digit lines 115-*a* or plate lines 210 of upper level levels of memory cells to a substrate positioned below the arrays of memory cells. The size of the connector or socket may be modified based on the configuration of the plate lines in the memory array.

In some cases, a memory array 100 that includes a plate (not shown) that is coupled with memory cells 105 associated with a plurality of different word lines 110 and/or digit lines 115 may have unique access operations. For example, the common plate may induce some parasitic signals in the memory array 100 that would not otherwise be present in other architectures. Consequently, techniques are provided for mitigating or reducing parasitic signals induced during an access operation of a memory array that includes a common plate.

The stored state of capacitor 205 may be read or sensed by operating various elements represented in circuit 200. Capacitor 205 may be in electronic communication with digit line 115-*a*. For example, capacitor 205 can be isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the threshold magnitude of the transistor. Word line 110-*a* may activate the selection component 220; for example, a voltage applied to word line 110-*a* is applied to the transistor gate, connecting capacitor 205 with digit line 115-*a*. As is described in more detail below, the access operations (e.g., read operation or write operation) may be modified based on the plate configuration of the memory array.

In other examples, the positions of selection component 220 and capacitor 205 may be switched, such that selection component 220 is connected between plate line 210 and cell plate 230 and such that capacitor 205 is between digit line 115-*a* and the other terminal of selection component 220. In this embodiment, selection component 220 may remain in electronic communication with digit line 115-*a* through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-*a*. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate." As is described in more detail below, the access operations (e.g., read operation or write operation) may be modified based on the plate configuration of the memory array.

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
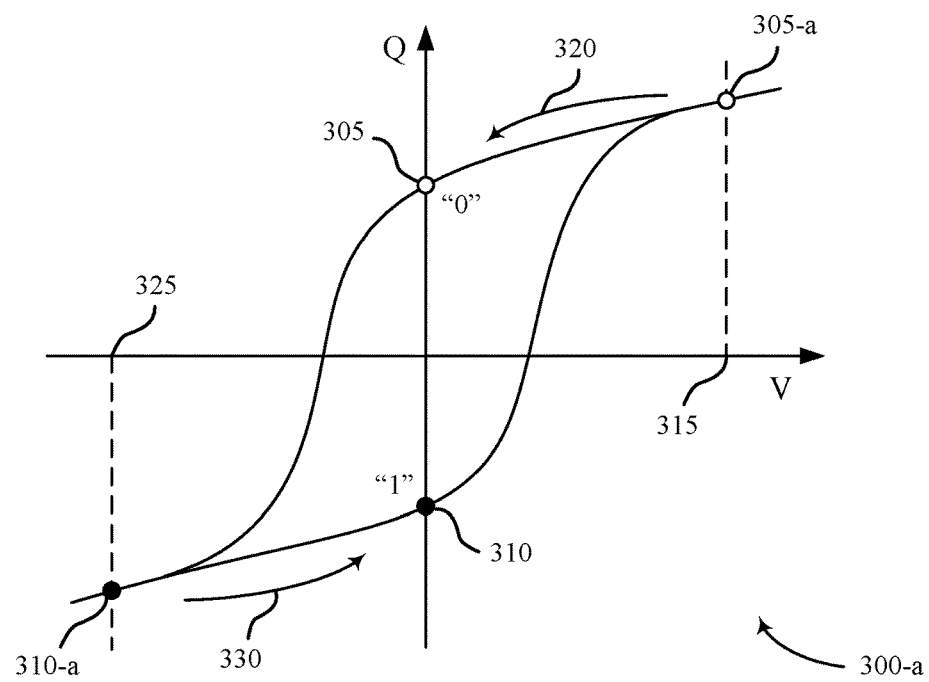
FIG. 3 illustrates an example of hysteresis curves that support techniques for accessing an array of memory cells in accordance with embodiments of the present disclosure.
Figure 3:
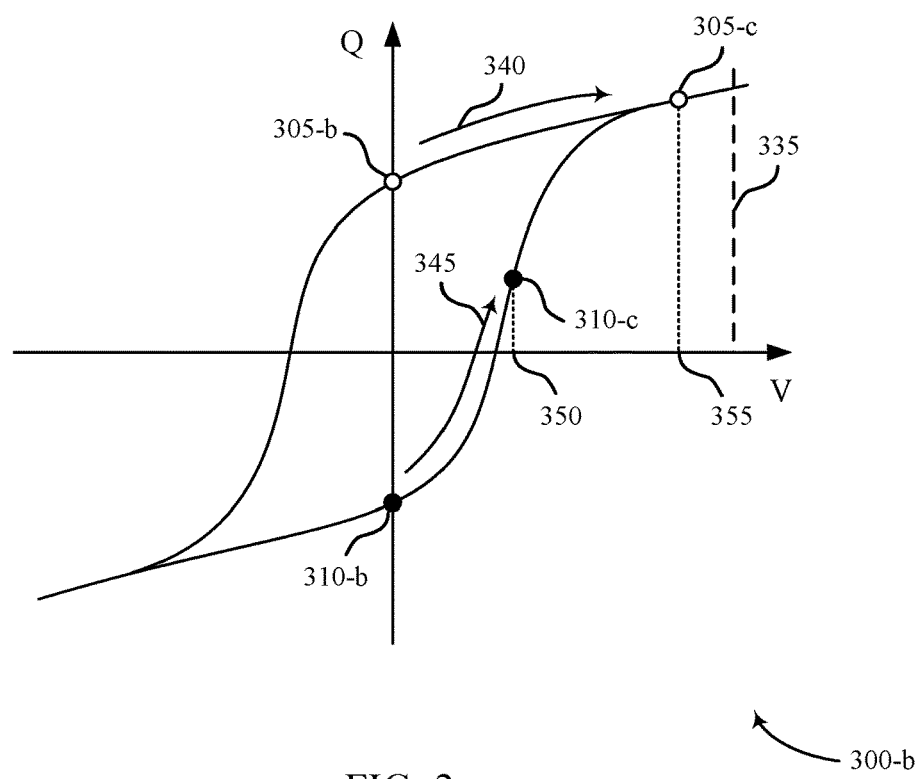

FIG. 3 illustrates an example of non-linear electrical properties with hysteresis curves 300-a and 300-b for a ferroelectric memory cell that is operated in accordance with various embodiments of the present disclosure. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-a and 300-b represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

In some examples of ferroelectric memory arrays, a plate line may be a coupled to multiple lines of memory cells (e.g., multiple digit lines and/or multiple word lines). In such configurations, die area may be used more efficiently and allocated to additional memory cells. Various examples of access operations associated with these plate configurations are described herein. For example, access operations may be configured to reduce or mitigate disturbs caused by coupling transitions of the plate and/or the selected digit line.

Figure 4:
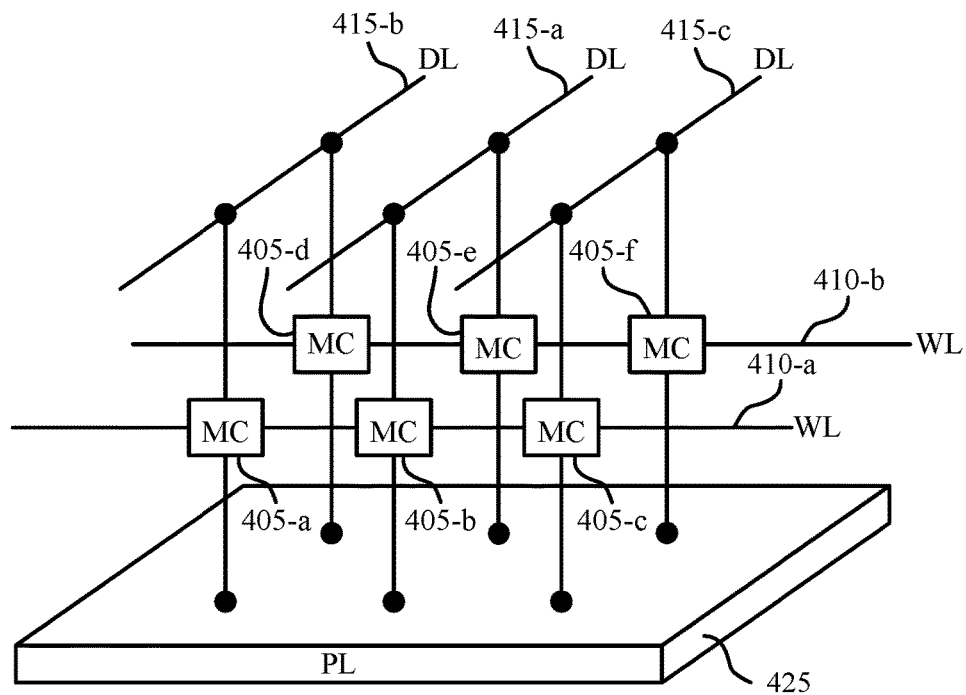
FIG. 4 illustrates an example of a memory device that supports techniques for accessing an array of memory cells in accordance with embodiments of the present disclosure.

FIG. 4 illustrates examples of a memory device 400 that supports techniques for accessing an array of memory cells in accordance with various aspects of the present disclosure. The memory device 400 may include a plurality memory cells 405 coupled with one or more word lines 410 and one or more digit lines 415 to form an array 420. The memory device 400 may include a plate 425 that is coupled with one or more memory cells 405 associated with multiple word lines 410 or multiple digit lines 415 in the array 420. For example, the plate 425 may be coupled with memory cells 405 that are associated with a first word lines 410-*a* and a second word line 410-*b* and/or memory cells 405 that are associated with a first digit line 415-*a*, a second digit line 415-*b*, and a third digit line 415-*b*. In some cases, a single plate 425 may be coupled with memory cells 405 associated with (e.g., coupled with) any number of word lines 410 or digit lines. The memory device 400 may be an example of the memory array 100 described with reference to FIG. 1.

In some examples, a quantity of plate nodes in an array of memory cells may be reduced relative to alternative architectures. This may result in more efficient use of die area in the memory array and/or more efficient use of power during access operations. In some cases, a plate driver associated with the plate 425 may be positioned outside of the memory array, thereby providing more space to other components of the array 420. In addition, the memory device 400 may be configured to reduce a number of plate drivers in an array of memory cells relative to alternative architectures.

In some cases, a single plate 425 may be coupled with memory cells 405 of different decks. In such cases, the single plate 425 may be coupled with memory cells of a first deck and memory cells of a second deck. Such arrangements may result in even more reductions in plates and plate drivers in the array 420.

Having a plate 425 common to multiple digit lines 415 may create undesirable coupling between different components of the array 420. During an access operation of a selected memory cell, such coupling may induce parasitic signals (e.g., capacitances, voltages, currents, etc.) on components of the array that are not intended to have signals during the access operation. In some cases, such parasitic signals may "disturb" the logic states stored on unselected memory cells. For example, the parasitic signals may cause a charge to be stored on a middle electrode of an unselected memory cell 415. In some cases, such parasitic signals may cause other components (e.g., word lines 410 and/or digit lines 415) to maintain an undesirable charge. For example, an access operation may induce a charge on a word line 410 or digit line 415 that affects the value read from a memory cell 405 or written to a memory cell 405 during a different access operation.

Such parasitic signals may be caused by biasing a plate 425 that is coupled with many different memory cells 405. During an access operation, usually only a small number of memory cells (e.g., one or more) are being accessed in a given segment of the array 420. In the illustrative example of FIG. 4, memory cell 405-*b* may be the selected memory cell and memory cells 405-*a*, 405-*c*, 405-*d*, 405-*e*, and 405-*f* may be unselected memory cells in an access operation (e.g., read, write, and/or precharge). Each of these memory cells 405 are coupled with a common plate 425. As different components are biased during an access operation (e.g., selected memory cell 405-b, plate 425, selected word line(s) 410-a, and/or selected digit line(s) 415-a), parasitic signals may be induced on other components (e.g., unselected memory cells 405, unselected word line(s) 410-b, unselected digit line(s) 415-b, 415-c, and/or other components such as some selected components).

Examples of specific disturbances caused during some access operations in the memory device 400 may be understood in relation to various components (e.g., selected components and unselected components). For example, when a selected digit line 415-a is biased from a first state to a second state (e.g., moves from a first voltage to a second voltage), a parasitic signal (e.g., a disturb) may be induced on adjacent unselected digit lines 415-b, 415-c. In some examples, when a selected word line 410-a is biased from a first state to a second state (e.g., moves from a first voltage to a second voltage), a parasitic signal (e.g., a disturb) may be induced on adjacent unselected word lines 410-b and other word lines not shown. In some examples, when a selected digit line 415-a is biased from a first state to a second state (e.g., moves from a first voltage to a second voltage), a parasitic signal (e.g., a disturb) may be induced on the selected word line 410-a. In some examples, when a selected digit line 415-a is biased from a first state to a second state (e.g., moves from a first voltage to a second voltage), a parasitic signal (e.g., a disturb) may be induced on unselected memory cells coupled with the selected digit line 415-a (e.g., memory cell 405-e).

In some cases, when the plate 425 is biased from a first state to a second (e.g., moves from a first voltage to a second voltage), a parasitic signal (e.g., a disturb) may be induced on a number of components. For example, biasing the plate 425 to a first voltage and biasing the unselected digit lines 415-b, 415-c to a second voltage different from the first voltage may cause the logic states stored on memory cells 405 coupled with the unselected digit lines 415-b, 415-c to be altered. To avoid altering these values, the unselected digit lines 415-b, 415-c may be biased to the same state as the plate 425. For example, if the plate 425 is biased to a first voltage as part of an access operation for the selected memory cell 405-b, the unselected digit lines 415-b, 415-c may also be biased to the first voltage.

Such operations, however, may not reduce or mitigate all of the parasitic capacitances that may occur during transitions of the plate 425 from a first state to a second state. In some cases, a state transition of the plate 425 and/or the unselected digit lines 415-b, 415-c may induce a parasitic signal (e.g., a disturb) on the selected digit line 415-a, the selected word line 410-a, unselected word lines 410-b, unselected memory cells 405, other components of the memory architecture (e.g., digit line drivers, plate drives, word line drivers, sense amplifiers, etc.), or a combination thereof.

In some cases, state transitions of the selected digit line 415-a while a plate 425 (and/or unselected digit lines 415-b, 415-c) are biased to a high voltage may induce parasitic signals (e.g., disturbs) on unselected digit lines 415-b, 415-c, word lines 410 (whether selected or unselected), other components, or a combination thereof. Such scenarios may occur with some frequency during an access operation of the selected memory cell 405-b.

In some cases, procedures may be performed to reduce parasitic signals associated with state transitions of the plate 425 during an access operation. Because the plate 425 is coupled to a plurality of memory cells that are coupled to a plurality of word lines 410 and digit lines 415, transitions of the plate 425 may be able to impact a large number of components of the memory device. Accordingly, during some access operations, the selected memory cell 405-b may be isolated from the selected digit line 415-a during a state transition of the plate 425. In some cases, procedure may be performed to reduce parasitic signals associated with state transitions of the selected digit line 415-a during an access operation. Accordingly, during some access operations, the selected memory cell 405-b may be isolated from the selected digit line 415-a when the selected digit line 415-a transitions from a first state to a second state.

The memory cells 405 may be examples of the memory cells 105 described with reference to FIGS. 1-2. In some cases, the memory cells 405 may be ferroelectric memory cells, DRAM memory cells, NAND memory cells, phase-change memory cells, or any other type of memory cells. The word lines 410 may be examples of word lines 110 described with reference to FIGS. 1-2. The digit lines 415 may be examples of the digit lines 115 described with reference to FIGS. 1-2. The plate 425 may be an example of the plate 210 described with reference to FIGS. 1-2.

Figure 5:
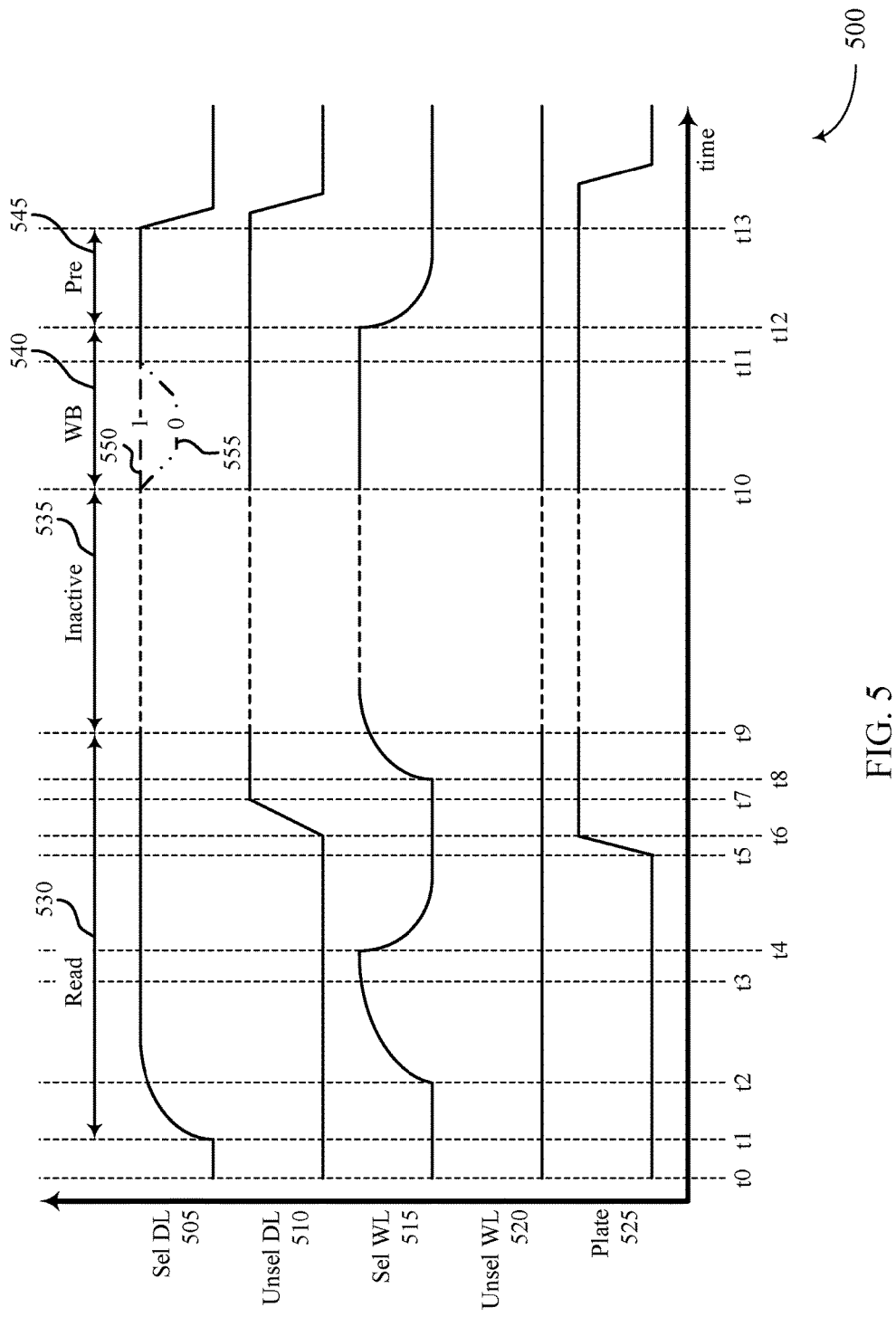
FIG. 5 illustrates an example of a timing diagram that supports techniques for accessing an array of memory cells in accordance with embodiments of the present disclosure.

FIG. 5 illustrates examples of a timing diagram 500 that supports techniques for accessing an array of memory cells in accordance with various aspects of the present disclosure. The timing diagram 500 illustrates procedures to mitigate or reduce parasitic signals induced by a transition of a plate from a first state to a second state during a read operation. The timing diagram 500 illustrates procedures to isolate the selected memory cell from the selected digit line while the plate transitions between states. In some cases, the principles and functions of the timing diagram 500 may be applied to a write operation or to any instance where the plate transitions from a first voltage level to a second voltage level.

The timing diagram 500 includes a selected digit line signal 505, an unselected digit line signal 510, a selected word line signal 515, an unselected word line signal 520, and a plate signal 525. In the example of the memory device 400 of FIG. 4 where the memory cell 405-b is the selected memory cell, the selected digit line signal 505 may correspond to a signal on the selected digit line 415-a during an access operation (e.g., read, write, write-back, precharge).

In the example of the memory device 400 of FIG. 4 where the memory cell 405-b is the selected memory cell, the unselected digit line signal 510 may correspond to a signal on one or more of the unselected digit lines 415-b, 415-c during the access operation. In the example of the memory device 400 of FIG. 4 where the memory cell 405-b is the selected memory cell, the selected word line signal 515 may correspond to a signal on the selected word line 410-a during an access operation. In the example of the memory device 400 of FIG. 4 where the memory cell 405-b is the selected memory cell, the unselected word line signal 520 may correspond to a signal on one or more of the unselected word lines 410-b. In the example of the memory device 400 of FIG. 4 where the memory cell 405-b is the selected memory cell, the plate signal 525 may correspond to a signal on the plate 425 during the access operation.

The timing diagram 500 illustrates a read operation that includes a number of different subintervals or portions. In other examples, the principles and functions of the timing diagram may be used with other access operations (e.g., write operation). For example, the functions and principles illustrated by the timing diagram 500 may be used any time a plate transitions between states. The timing diagram 500 may include a read portion 530, an inactive portion 535, a write-back portion 540, and a precharge portion 545.

At time t0, the memory device may be in an idle state with no access operation being executed. As such, the signals 505-525 may be biased to a low voltage, such as a ground voltage, a virtual ground voltage, or some other voltage that denotes a low bias state. Around time t0, a controller may initiate an access operation and may select a memory cell on which to perform the access operation. Examples of an access operation may include a read operation, a write operation, a write-back operation, a precharge operation, a pre-read operation, or a combination thereof.

At time t1, the memory device may initiate the access operation performed on the selected memory cell. In the illustrative example, the memory device may initiate the read portion 530 of the access operation. The memory device may bias the digit line coupled with the selected memory cell (e.g., the selected digit line). In such cases, the selected digit line signal 505 may transition from a low voltage to a high voltage different from the low voltage.

At time t2, the memory device may couple the selected memory cell to the selected digit line by activating a selection component (e.g., a transistor). To activate the selection component, the memory device may bias the selected word line signal 515 from a low voltage to a high voltage. The word line may be coupled to a gate of the selection component. The low voltage and the high voltage of the selected word line signal 515 may be configured such that one voltage satisfies the threshold voltage of the selection component and the other voltage does not.

In some cases, the selection component may be an n-type transistor that allows current to flow when its gate voltage is high. In other cases, the selection component may be a p-type transistor that allows current to flow when its gate voltage is low. Regardless of the type of transistor, the timing diagram 500 illustrates that the selected memory cell is coupled with the selected digit line at time t2. With this in mind, the selected word line signal 515 and the unselected word line signal 520 represent signals for an n-type transistor. In some cases, the signals 515 and 520 may be modified to work with a p-type transistor. Between time t2 and time t3, a capacitor of the selected memory cell may output its stored charge onto the selected digit line.

At time t3, the memory device may fire the sense amplifier (e.g., sense component 125) to identify a logic state stored on the selected memory cell. If the voltage of the digit line exceeds a reference voltage, the memory device may conclude that a first logic state is stored on the selected memory device (e.g., a logic 1). If the voltage of the digit line is below the reference voltage, the memory device may conclude that a second logic state is stored on the selected memory device (e.g., a logic 0). Once the memory device has identified the stored logic state, the memory device may output the logic state to the host device that requested the access operation. In some cases, the memory device may be configured to identify more than two logic state states stored on a memory device (e.g., four, eight, or sixteen memory states). In such cases, the memory cell may be a multi-level memory cell. In some examples, a read operation may be configured to read a charge stored on a memory cell without varying the voltage of the digit line beyond a predefined criteria such as a threshold. For example, a memory device may tolerate a certain amount of perturbations of the voltage on the digit line in such cases, but if the voltage varies by more than a threshold it may disturb the operations of the memory device. In such examples, the functions of a sense amplifier may be modified to be compatible with the one or more read operations.

The inactive portion 535 of the access operation may occur after the memory device has identified the logic state stored on the selected memory cell and/or output the identified logic state to the host device. The inactive portion 535 (e.g., between time t9 and time 10) may last for a duration that exceeds the read portion as the memory device waits for the host device to perform its portions of the access operation. In some cases, the inactive portion 535 may be up to two micro seconds. In contrast, the duration between time t3 and time t4 may be around twenty nanoseconds.

In some cases, such as when reading a ferroelectric memory cell, the read operation may destroy the logic state stored on the selected memory cell. In such cases, the access operation may include a write-back operation (e.g., the write-back portion 540), which may occur after the inactive portion 535. To write values to the selected memory cell, the plate may need to be biased to a high voltage level. Biasing the plate and the selected digit line in or around the same time during the write-back operation may induce more parasitic signals than is desirable. In some cases, to avoid biasing the plate and the selected digit line during the write-back operation, the plate may be biased during a time period (sometimes referred to as an active time period) between firing the sense amplifier (e.g., time t3) and entering the inactive portion 535 (e.g., time t9).

Moving when the plate transitions between different states, however, may not completely eliminate parasitic signals induced by such a biasing. Rather, such a change in the access operation may reduce parasitic signals induced by the combination of biasing both the plate and the selected digit line during such a short duration. To further reduce or mitigate parasitic signals induced by a transition of the plate, the selected memory cell may be isolated from the selected digit line during the transition of the plate. By isolating the selected memory cell, it may decouple (e.g., capacitively decouple) a number of components from plate and thereby reduce disturbances to the logic states stored in memory cells of the memory array and disturbances to related components that may affect future access operations. Further, by isolating the selected memory cell, the duration of the transition between the first state and the second state of the plate may be performed faster than in other architectures (e.g., five nanoseconds).

At time t4, the memory device may begin the process of biasing the plate to a new voltage after sensing the stored value of the selected memory cell. After the sense amplifier has been activated, the selected memory cell may be isolated from the selected digit line. To isolate the selected memory cell, the selection component may be deactivated. The selected word line signal 515, which is coupled with a gate of the selection component, may be biased from a high voltage to a low voltage, thereby deactivating the selection component.

At time t5, after the selected memory cell is isolated from the selected digit line, the plate may be biased from a first voltage to a second voltage. In the illustrative example, the plate signal 525 goes from a low voltage to a high voltage. These principles may apply in other plate transitions (e.g., from low-to-high, high-to-low, transitions between intermediate voltage levels, or a combination thereof). In some cases, the memory device may identify when a plate transition is to occur and the memory device may perform the selected memory cell isolation techniques described. In some cases, the identification of plate transitions may be done dynamically where the memory device is listening to commands from a controller and performs these steps based on the plate transition. In some cases, the identification of plate transitions may be done statically.

For example, the isolation techniques discussed herein may be built into predefined access operations. In some cases, the memory device may identify a start time of the plate transition and/or a plate transition duration and may configure the selected memory cell isolation techniques based on the start time and/or the duration so that the selected memory cell is isolated during the entire plate transition. When an access operation is being performed, a memory device may analyze one or more commands of the access operation (before issuing the commands) to identify a plate transition. Once a plate transition is identified and/or after a timing for starting the plate transition using the command is reached, the memory device may issue an isolation command prior to issuing the plate transition command. Similarly the memory device may identify a plate transition duration so that the re-coupling of the digit line to the memory cell may occur after the transition is complete. In some cases, the memory device may issue an independent re-coupling command. In some cases, the isolation command issued by the memory device may include the re-coupling command offset by a timer, counter, or some other mechanism.

At time t6, the plate transition to the new voltage level may be complete. Because the selected memory cell is isolated during the plate transition, the duration for the plate transition may be faster than other architecture where such an isolation occurs. The faster the transition between voltage levels, the more likely parasitic signals will be induced and the strength of such parasitic signals may be increase based on the speed of the transition. In some architectures, the plate transition is lengthened out to mitigate/reduce parasitic signals induced on other components.

Due to decoupling the selected memory cell from the selected digit line, the transition duration for the plate may be decreased. In some cases, the plate transition duration may be about five nanoseconds or less (e.g., five nanoseconds, four nanoseconds, three nanoseconds, two nanoseconds, or one nanosecond). In some cases, selected memory cell may be isolated based on a duration for performing a transition expiring. In such cases, the transition may or may not occur, but the selected memory cell may be isolated during that period regardless of whether the transition occurs.

Sometime after the plate begins transitioning (e.g., at time t6), the unselected digit lines may be biased to the same voltage as the plate. Because plate is coupled with memory cells coupled with a plurality of digit lines, if the plate is biased to a different voltage than an associated digit line, the value stored on the memory cell may be affected. To avoid disturbing unselected memory cells, the unselected digit lines and the plate may be biased to the same voltage level. The unselected digit line signal 510 may be biased from a first state to a second state between times t6 and t7. In some cases, the unselected digit lines and the plate may be coupled with a conductor (e.g., a shunt line) during the access operation. In some cases, the unselected digit lines and the plate may be biased based on independent drivers controlled to be at the same or similar voltage level.

At time t7, the transition of the unselected digit lines to the new voltage level may be complete. Because the selected memory cell is isolated during the transition, the duration for the transition may be faster than other architectures where such an isolation occurs. Due to decoupling the selected memory cell from the selected digit line, the transition duration for the unselected digit lines may be decreased. In some cases, the transition duration may be about five nanoseconds or less (e.g., five nanoseconds, four nanoseconds, three nanoseconds, two nanoseconds, or one nanosecond). In some cases, selected memory cell may be isolated based on a duration for performing a transition expiring. In such cases, the transition may or may not occur, but the selected memory cell may be isolated during that period regardless of whether the transition occurs.

At time t8, after the plate and the unselected digit lines are biased to new voltages (e.g., using the unselected digit line signal 510 and/or the plate signal 525), the memory device may couple (or re-couple as the case may be) the selected memory cell to the selected digit line. The selected digit line may be coupled with the selected memory cell by activating the selection component using the selected word line signal 515. In such cases, the selected word line signal 515 may go to a high voltage and cause the selection component to conduct current between its two nodes.

By isolating the selected memory cell from the selected digit line during transitions of the plate and the unselected digit lines, the memory device may reduce/mitigate parasitic signals induced on other components caused by those transitions. Further, by performing these transitions during an active time period between firing the sense amplifier and entering the inactive portion 535, instead of after the inactive portion 535, the memory device may reduce/mitigate parasitic signals induced or made worse by transitioning both the selected digit line, the plate, and the unselected digit lines in close proximity. In some cases, by moving the plate transition to the active period before the inactive period, isolating the selected digit line can occur without increasing the total time of the access operation. If the plate was transitioned after the inactive period, additional time may be added to access operation to isolate the selected memory cell during the plate transition and then transitioning the selected digit line, rather than performing those operations concurrently.

At time t10, the inactive portion 535 may be complete and the write-back portion 540 of the access operation may begin. In some cases, because the plate and the unselected digit lines were already biased before the beginning of the inactive portion 535, the selected digit line signal 505, the unselected digit line signal 510, the selected word line signal 515, and the plate signal 525 may be biased to a high voltage.

At or soon after time t10, the selected digit line signal 505 may transition to or maintain a first voltage 550 to write a logic 1 (e.g., a high voltage) or transition to or maintain a second voltage 555 to write a logic 0 (e.g., a low voltage). In the cases where the memory cell is a multi-level memory cell capable of storing more than one bit of information, the selected digit line signal 505 may be biased to one of more than two signal levels. While the selected digit line is biased to one of its voltages based on the desired logic state to be written to the selected memory cell, the plate signal 525, the unselected digit line signal 510, and/or the selected word line signal 515 may remain high. The memory device may maintain the selected voltage level for a certain duration (e.g., between time t10 and time t11).

At time t11, the selected digit line signal 505 may be biased to a high voltage. The biasing may begin before time t11 in some circumstances. The duration during which the selected voltage level is maintained may be configured based on the writing requirements of the memory device. In some cases, the transition from a first voltage to a second voltage may take place over a certain duration. In some cases, the transition of the selected digit line during the write-back portion 540 may be about five nanoseconds or less (e.g., five nanoseconds, four nanoseconds, three nanoseconds, two nanoseconds, or one nanosecond). In some cases, selected memory cell may be isolated based on a duration for performing a transition expiring. In such cases, the transition may or may not occur, but the selected memory cell may be isolated during that period regardless of whether the transition occurs.

At time t12, the write-back portion 540 may be completed and the precharge portion 545 may be begin. The memory device may isolate the selected memory cell from the selected digit line by sending the selected word line signal 515 to a low voltage thereby deactivating the selection component. Once the selected memory cell is deactivated, the memory device may be precharged in preparing for the next access operation. In some cases, precharging may include biasing (or maintaining) the selected digit line signal 505, the unselected digit line signal 510, and the plate signal 525 to a high voltage level during a precharge period.

At time t13, the memory device may send the selected digit line signal 505, the unselected digit line signal 510, and the plate signal 525 back to a low signal in to be ready for the next access operation. In some cases, the biasing of these signals may be done concurrently. In some cases, the biasing of the signals may be cascaded so that they don't perfectly overlap. In some cases, the plate signal 525 may transition after the digit lines have transitioned.

Figure 6:
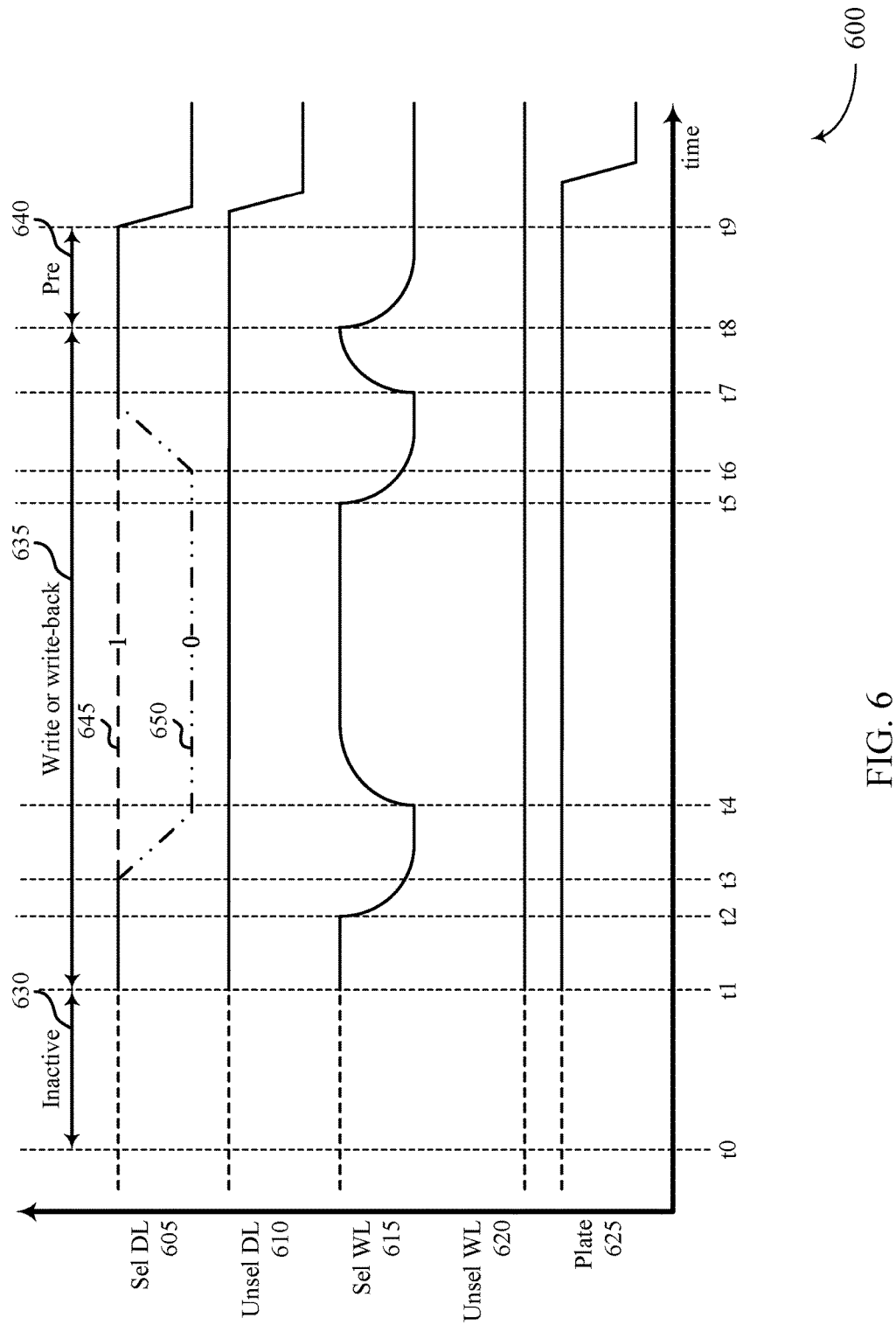
FIG. 6 illustrates an example of a timing diagram that supports techniques for accessing an array of memory cells in accordance with embodiments of the present disclosure.

FIG. 6 illustrates examples of a timing diagram 600 that supports techniques for accessing an array of memory cells in accordance with various aspects of the present disclosure. The timing diagram 600 illustrates procedures to mitigate or reduce parasitic signals induced by a transition of a selected digit line from a first state to a second state during a write or write-back operation. The timing diagram 600 illustrates procedures to isolate the selected memory cell from the selected digit line while the selected digit line transitions between states. In some cases, the principles and functions of the timing diagram 600 may be applied to a read operation or to any instance where the selected digit line transitions from a first voltage to a second voltage.

The timing diagram 600 includes a selected digit line signal 605, an unselected digit line signal 610, a selected word line signal 615, an unselected word line signal 620, and a plate signal 625. In the example of the memory device 400 of FIG. 4 where the memory cell 405-*b* is the selected memory cell, the selected digit line signal 605 may correspond to a signal on the selected digit line 415-*a* during an access operation (e.g., read, write, write-back, precharge). In the example of the memory device 400 of FIG. 4 where the memory cell 405-*b* is the selected memory cell, the unselected digit line signal 610 may correspond to a signal on one or more of the unselected digit lines 415-*b*, 415-*c* during the access operation. In the example of the memory device 400 of FIG. 4 where the memory cell 405-*b* is the selected memory cell, the selected word line signal 615 may correspond to a signal on the selected word line 410-*a* during an access operation. In the example of the memory device 400 of FIG. 4 where the memory cell 405-*b* is the selected memory cell, the unselected word line signal 620 may correspond to a signal on one or more of the unselected word lines 410-*b*. In the example of the memory device 400 of FIG. 4 where the memory cell 405-*b* is the selected memory cell, the plate signal 625 may correspond to a signal on the plate 425 during the access operation.

The timing diagram 600 illustrates a write operation or a write-back operation that includes a number of different portions. In other examples, the principles and functions of the timing diagram may be used with other access operations (e.g., read operation). For example, the functions and principles illustrated with the timing diagram 600 may be used any time a selected digit line transitions between states. The timing diagram 600 may include an inactive portion 630, a write portion 635 (or write back portion), and precharge portion 640.

The timing diagram 600 illustrates procedures to isolate the selected memory cell from the selected digit line when the selected digit line transitions from a first state to a second state. For example, in a write operation, the memory device may bias the selected digit line based on a logic state that the memory device wants to store in the selected memory cell. By isolating the selected memory cell during transitions of the selected digit line, the memory device may be configured to mitigate or reduce parasitic signals induced on other components of the memory device (e.g., unselected memory cells, unselected digit lines, word lines, plates, drivers, or a combination thereof).

The timing diagram 600 illustrates these procedures in the context of a write-back operation that occurs after a read operation. These procedures, however, may be performed any time a selected digit line transitions states. For example, these procedures may be implemented as part of a write operation. In some cases, the memory device may identify when a selected digit line transition is to occur and the memory device may perform the selected memory cell isolation techniques described. In some cases, the identification of selected digit line transitions may be done dynamically where the memory device is listening to commands from a controller and performs these steps based on the occurrence of the selected digit line transition. In some cases, the identification of selected digit line transitions may be done statically. For example, the isolation techniques discussed herein may be built into predefined access operations. In some cases, the memory device may identify a start time of the selected digit line transition and/or a selected digit line transition duration and may configure the selected memory cell isolation techniques based on the start time and/or the duration so that the selected memory cell is isolated during the entire selected digit line transition.

In some cases, the procedures of the timing diagram 600 may be used in conjunction with the procedures of the timing diagram 500. In such cases, the selected memory cell may be isolated during both plate transitions (including associated unselected digit line transitions) and selected digit line transitions). It should be noted that the methods, functions, and/or procedures of the timing diagram 500 and the timing diagram 600 may be rearranged or otherwise modified such that other implementations are possible. Further, various aspects from the timing diagrams 500 and 600 may be combined in a variety of ways.

At time t0 in the illustrative example, the memory device may be operating in an inactive portion 630 of an access operation reserved for use by the host device that requested the access operation. During the inactive portion 630, the requesting device may perform one or more operations based on the results of the read portion of the access operation. In some cases, the signals 605-625 may be initialized to different values than those shown in the timing diagram 600. For example, during a write operation, the signals may be initialized to different values.

At time t1, the inactive portion 630 may be complete and the write-back portion 635 of the access operation may begin. The memory device may identify a potential time for a selected digit line transition (e.g., at time t3).

At time t2, the memory device may begin the process of biasing the selected digit line to a new voltage. The memory device may isolate the selected memory cell from the selected digit line. To isolate the selected memory cell, the selection component of the selected memory cell may be deactivated. The selected word line signal 615, which is coupled with a gate of the selection component, may be biased from a high voltage to a low voltage, thereby deactivating the selection component.

At time t3, after the selected memory cell is isolated from the selected digit line, the selected digit line may be biased from a first voltage to a second voltage. For example, the selected digit line signal 605 may transition to or maintain a first voltage 645 to write a logic 1 (e.g., a high voltage) or transition to or maintain a second voltage 650 to write a logic 0 (e.g., a low voltage). In the cases where the memory cell is a multi-level memory cell capable of storing more than one bit of information, the selected digit line signal 605 may be biased to one of more than two signal levels.

While the selected digit line is biased to one of its voltages based on the desired logic state to be written to the selected memory cell, the plate signal 625, the unselected digit line signal 610, and/or the selected word line signal 615 may remain high. The memory device may maintain the selected voltage level for a certain duration (e.g., between just before time t4 and time t6). The transition of the selected digit line may take place over a certain duration. In some cases, the transition of the selected digit line during the write-back portion 635 may be about five nanoseconds or less (e.g., five nanoseconds, four nanoseconds, three nanoseconds, two nanoseconds, or one nanosecond). In some cases, selected memory cell may be isolated based on a duration for performing a transition expiring. In such cases, the transition may or may not occur, but the selected memory cell may be isolated during that period regardless of whether the transition occurs.

At time t4, after the selected digit line has completed its transition (or after the duration for the transition has expired), the memory device may couple the selected memory cell to the selected digit line by activating the selection component of the selected memory cell. To activate the selection component, the memory device may bias the selected word line signal 615 to an activation voltage (e.g., a high voltage). Once the selected word line signal 615 satisfies the gate threshold voltage of the selection component, the selected memory cell will be coupled with the selected digit line.

Between the time t4 and time t5, the value indicated by the selected digit line signal 605 (e.g., first voltage 645 or second voltage 650) is written to the selected memory cell. The duration of the write operation may be a predefined duration based on characteristics of the memory cell.

At time t5, the memory device may isolate the selected memory cell from the selected digit line in preparation for the selected digit line to transition again to a different case. In some cases, the selected digit line may transition to a precharge value associated with the precharge portion 640.

At time t6, after the selected memory cell is isolated, the selected digit line signal 605 may be biased to a new voltage. Once the transition of the selected digit line is complete (or until the transition duration has expired), at time t7, the memory device may couple the selected memory cell to the selected digit line by activating the selection component. To do this, the selected word line signal 615 may be biased to an activation voltage of the selection component. In some cases, the transition of the selected digit line during the write-back portion 635 may be about five nanoseconds or less (e.g., five nanoseconds, four nanoseconds, three nanoseconds, two nanoseconds, or one nanosecond). In some cases, selected memory cell may be isolated based on a duration for performing a transition expiring. In such cases, the transition may or may not occur, but the selected memory cell may be isolated during that period regardless of whether the transition occurs.

At time t8, the precharge portion 640 of the access operation may begin. The memory device may isolate the selected memory cell from the selected digit line by sending the selected word line signal 615 to a low voltage thereby deactivating the selection component. Once the selected memory cell is deactivated, the memory device may be precharged in preparing for the next access operation. In some cases, precharging may include biasing (or maintaining) the selected digit line signal 605, the unselected digit line signal 610, and the plate signal 625 to a high voltage level during a precharge portion 640.

At time t9, the memory device may send the selected digit line signal 605, the unselected digit line signal 610, and the plate signal 625 back to a low signal in to be ready for the next access operation. In some cases, the biasing of these signals may be done concurrently. In some cases, the biasing of the signals may be cascaded so that they don't perfectly overlap. In some cases, the plate signal 625 may transition after the digit line signals 605, 610 have transitioned.

Figure 7:
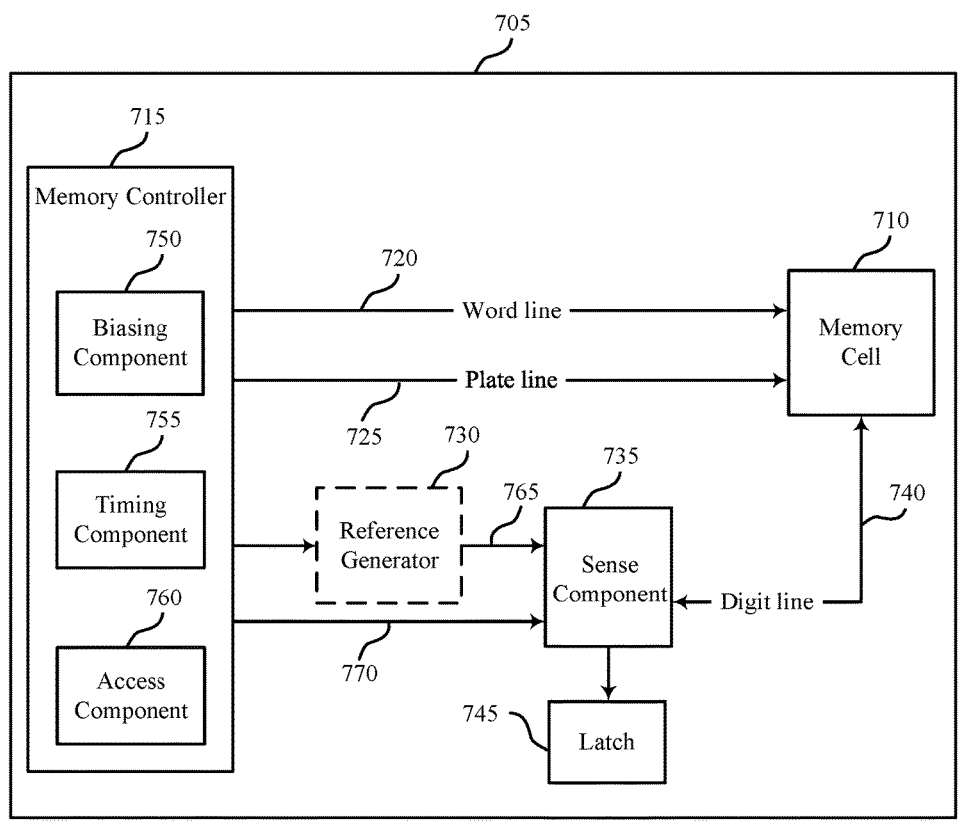
FIGS. 7 through 8 show block diagrams of a device that supports techniques for accessing an array of memory cells in accordance with embodiments of the present disclosure.

FIG. 7 shows a block diagram 700 of a memory array 705 that supports techniques for accessing an array of memory cells in accordance with embodiments of the present disclosure. Memory array 705 may be referred to as an electronic memory apparatus, and may be an example of a component of a memory device 100 or 400 as described herein.

Memory array 705 may include one or more memory cells 710, a memory controller 715, a word line 720, a plate line 725, a reference generator 730, a sense component 735, a digit line 740, and a latch 745. These components may be in electronic communication with each other and may perform one or more of the functions described herein. In some cases, memory controller 715 may include biasing component 750 and timing component 755. In some cases, sense component 735 may serve as the reference generator 730. In other cases, reference generator 730 may be optional.

Memory controller 715 may be in electronic communication with word line 720, digit line 740, sense component 735, and plate line 725, which may be examples of word line 110, digit line 115, sense component 125, and plate line 210 described with reference to FIGS. 1, and 2. Memory array 705 may also include reference generator 730 and latch 745. The components of memory array 705 may be in electronic communication with each other and may perform aspects of the functions described with reference to FIGS. 1 through 6. In some cases, reference generator 730, sense component 735, and latch 745 may be components of memory controller 715.

In some examples, digit line 740 is in electronic communication with sense component 735 and a ferroelectric capacitor of ferroelectric memory cells 710. A ferroelectric memory cell 710 may be writable with a logic state (e.g., a first or second logic state). Word line 720 may be in electronic communication with memory controller 715 and a selection component of ferroelectric memory cell 710. Plate line 725 may be in electronic communication with memory controller 715 and a plate of the ferroelectric capacitor of ferroelectric memory cell 710. Sense component 735 may be in electronic communication with memory controller 715, digit line 740, latch 745, and reference line 765. The reference generator 730 may be in electronic communication with memory controller 715 and reference line 765. Sense control line 770 may be in electronic communication with sense component 735 and memory controller 715. These components may also be in electronic communication with other components, both inside and outside of memory array 705, in addition to components not listed above, via other components, connections, or buses.

Memory controller 715 may be configured to activate the word line 720, plate line 725, or digit line 740 by applying voltages to those various nodes. For example, biasing component 750 may be configured to apply a voltage to operate the memory cell 710 to read or write memory cell 710 as described above. In some cases, memory controller 715 may include a row decoder, column decoder, or both, as described herein. This may enable the memory controller 715 to access one or more memory cells 105. Biasing component 750 may also provide voltage to reference generator 730 in order to generate a reference signal for sense component 735. Additionally, biasing component 750 may provide voltage for the operation of sense component 735.

In some cases, memory controller 715 may perform its operations using timing component 755. For example, timing component 755 may control the timing of the various word line selections or plate biasing, including timing for switching and voltage application to perform the memory functions, such as reading and writing, discussed herein. In some cases, timing component 755 may control the operations of biasing component 750.

The reference generator 730 may include various components to generate a reference signal for sense component 735. The reference generator 730 may include circuitry configured to produce a reference signal. In some cases, reference generator 730 may be implemented using other ferroelectric memory cells 105. Sense component 735 may compare a signal from memory cell 710 (through digit line 740) with a reference signal from reference generator 730. Upon determining the logic state, the sense component may then store the output in latch 745, where it may be used in accordance with the operations of an electronic device that memory array 705 is a part. Sense component 735 may include a sense amplifier in electronic communication with the latch and the ferroelectric memory cell.

Access component 760 may be an example of aspects of the access component 915 described with reference to FIG. 9. Access component 760 and/or at least some of its various sub-components may be implemented in hardware, software executed by a processor, firmware, or any combination thereof. If implemented in software executed by a processor, the functions of the access component 760 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The access component 760 and/or at least some of its various sub-components may be physically located at various positions, including being distributed such that portions of functions are implemented at different physical locations by one or more physical devices. In some examples, access component 760 and/or at least some of its various sub-components may be a separate and distinct component in accordance with various embodiments of the present disclosure. In other examples, access component 760 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Access component 760 may activate a sense amplifier coupled with a first memory cell of an array of memory cells using a first digit line as part of a read operation, isolate the first memory cell from the first digit line after activating the sense amplifier, bias a plate coupled with the first memory cell from a first voltage to a second voltage while the first memory cell is isolated from the first digit line, and couple the first memory cell with the first digit line after the plate is biased to the second voltage. The access component 760 may also identify a digit line transition from a first voltage to a second voltage, isolate a memory cell from the digit line based on identifying the digit line transition, bias the digit line from the first voltage to the second voltage while the memory cell is isolated from the digit line, and couple the memory cell with the digit line after the digit line is biased to the second voltage. The access component 760 may also perform a write operation on a memory cell coupled with a digit line and a plate, couple the digit line to the plate after the write operation is complete, isolate the memory cell from the digit line based on coupling the digit line to the plate, and ground the digit line and the plate based at least in part isolating the memory cell from the digit line. The access component 760 may also identify a transition of a plate of a memory device from a first voltage to a second voltage during an access operation performed on a memory cell, isolate the memory cell from a digit line based on identifying the transition, bias the plate to the second voltage while the memory cell is isolated from the digit line, and couple the memory cell with the digit line based on the plate being biased to the second voltage.

Figure 8:
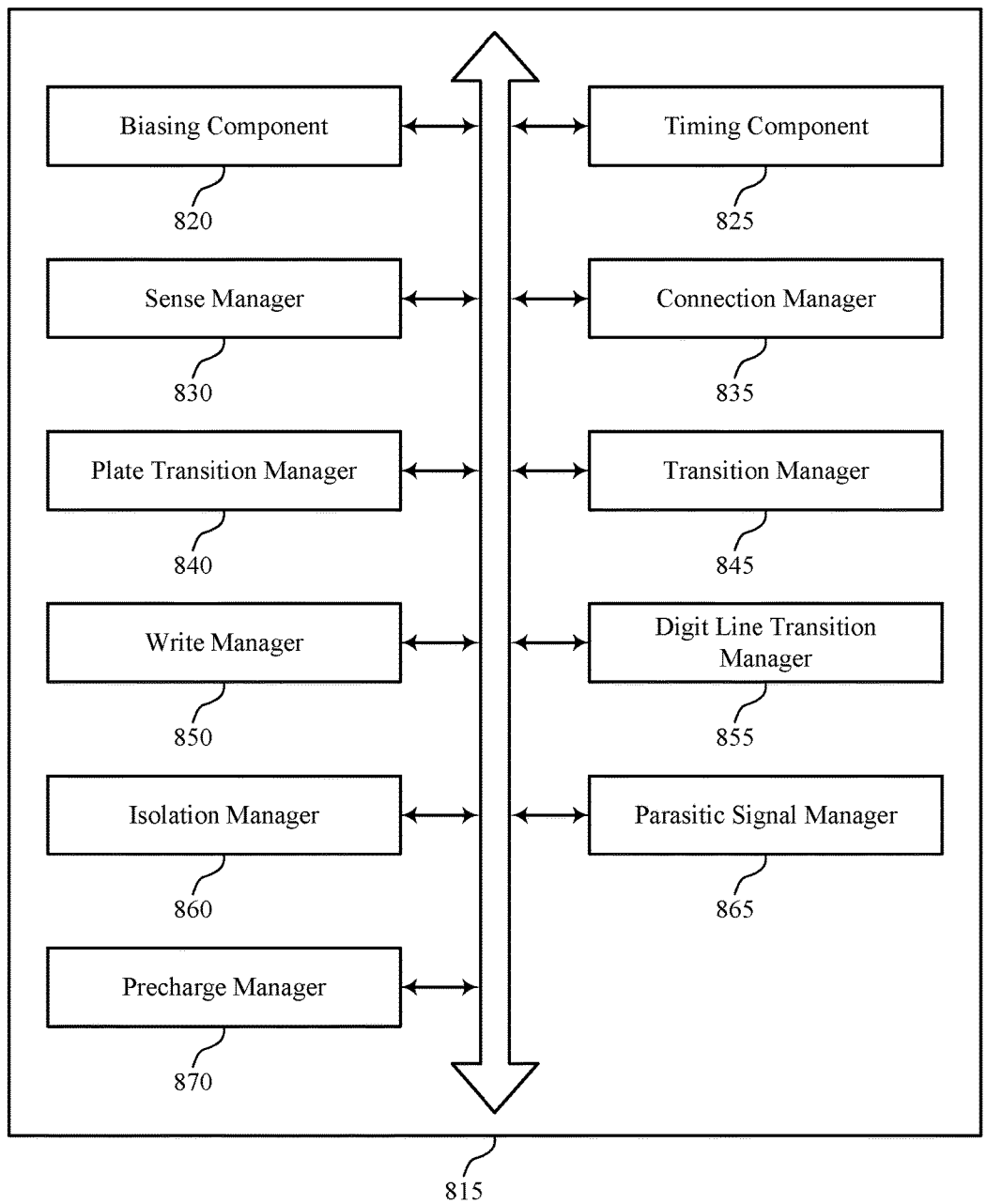

FIG. 8 shows a block diagram 800 of a access manager 815 that supports techniques for accessing an array of memory cells in accordance with embodiments of the present disclosure. The access manager 815 may be an example of aspects of a access component 915 described with reference to FIGS. 6, 7, and 9. The access manager 815 may include biasing component 820, timing component 825, sense manager 830, connection manager 835, plate transition manager 840, transition manager 845, write manager 850, digit line transition manager 855, isolation manager 860, parasitic signal manager 865, and precharge manager 870. Each of these modules may communicate, directly or indirectly, with one another (e.g., via one or more buses).

Sense manager 830 may activate a sense amplifier coupled with a first memory cell of an array of memory cells using a first digit line as part of a read operation. In some cases, the first memory cell is a ferroelectric memory cell.

Connection manager 835 may isolate the first memory cell from the first digit line after activating the sense amplifier, couple the memory cell with the digit line based on the plate being biased to the second voltage, couple the first memory cell with the first digit line includes activating a switching component coupled with the first memory cell and the first digit line, isolate a memory cell from the digit line based on identifying the digit line transition, couple the memory cell with the digit line after the digit line is biased to the second voltage, isolate the memory cell from the digit line based on identifying the second digit line transition, couple the first memory cell with the first digit line after the plate is biased to the second voltage, couple the digit line to the plate after the write operation is complete, isolate the memory cell from the digit line based on coupling the digit line to the plate, ground the digit line and the plate based at least in part isolating the memory cell from the digit line, isolate the memory cell from a digit line based on identifying the transition, bias the plate to the second voltage while the memory cell is isolated from the digit line, couple the memory cell with the digit line based on the digit line being biased to the first voltage, In some cases, the plate is coupled with memory cells of an array of memory cells that are coupled with the first digit line and one or more unselected digit lines. In some cases, the plate includes a sheet coupled with multiple rows or multiple columns of memory cells.

Plate transition manager 840 may bias a plate coupled with the first memory cell from a first voltage to a second voltage while the first memory cell is isolated from the first digit line, determine a transition time for biasing the plate from the first voltage to the second voltage based on isolating the first memory cell from the first digit line, where the transition time when the first memory cell is isolated from the first digit line is longer than a transition time for biasing the plate when the first memory cell is coupled with the first digit line, bias the plate to the second voltage from the first voltage based on isolating the first memory cell after the write-back operation, In some cases, the first memory cell is isolated from the first digit line during a duration that begins after activating the sense amplifier as part of the read operation and ends before a write-back operation is initiated. In some cases, the plate is coupled with multiple rows or multiple columns of memory cells of a first deck and with multiple rows or multiple columns of memory cells of a second deck.

Transition manager 845 may identify a digit line transition from a first voltage to a second voltage, bias the digit line from the first voltage to the second voltage while the memory cell is isolated from the digit line, identify a second digit line transition back from the second voltage to the first voltage, the second digit line transition occurring after a write-back operation is complete, bias the digit line from the second voltage to the first voltage while the memory cell is isolated from the digit line, identify a transition of a plate of a memory device from a first voltage to a second voltage during an access operation performed on a memory cell, and isolate the memory cell from the digit line is performed for at least one transition of the plate that occurs during the access operation performed on the memory cell.

Write manager 850 may perform a write-back operation after coupling the memory cell with the digit line and perform a write operation on a memory cell coupled with a digit line and a plate.

Digit line transition manager 855 may bias a second digit line that is coupled with the plate to the second voltage after the first memory cell is isolated from the first digit line, couple the second digit line with the plate, where biasing the plate and the second digit line are based on coupling the second digit line with the plate, identify a start time of the digit line transition, identify an isolation duration associated with the memory cell based on identifying the start time, and isolating the memory cell based on the isolation duration and the start time, couple an unselected digit line with the plate after the write operation is complete, where the unselected digit line is coupled with memory cells that are coupled with the plate, and/or ground the unselected digit line based at least in part isolating the memory cell from the digit line.

Isolation manager 860 may isolate the first memory cell from the first digit line after a write-back operation is complete.

Parasitic signal manager 865 may bias the plate while the first memory cell is isolated from the first digit line decouples the first digit line from the plate and mitigates a parasitic signal induced on the first digit line, bias the plate while the first memory cell is isolated from the first digit line decouples the first digit line from the plate and mitigates a parasitic signal induced on a second memory cell coupled with the first digit line, bias the plate while the first memory cell is isolated from the first digit line decouples the first digit line from the plate and mitigates a parasitic signal induced on a second word line, bias the digit line while the memory cell is isolated from the digit line decouples the digit line from the plate and mitigates a parasitic signal induced on an unselected memory cell, In some cases, the parasitic signal is a charge accumulation on a cell bottom of the second memory cell.

Precharge manager 870 may initiate a precharge operation based on coupling the digit line to the plate after the write operation is complete.

Figure 9:
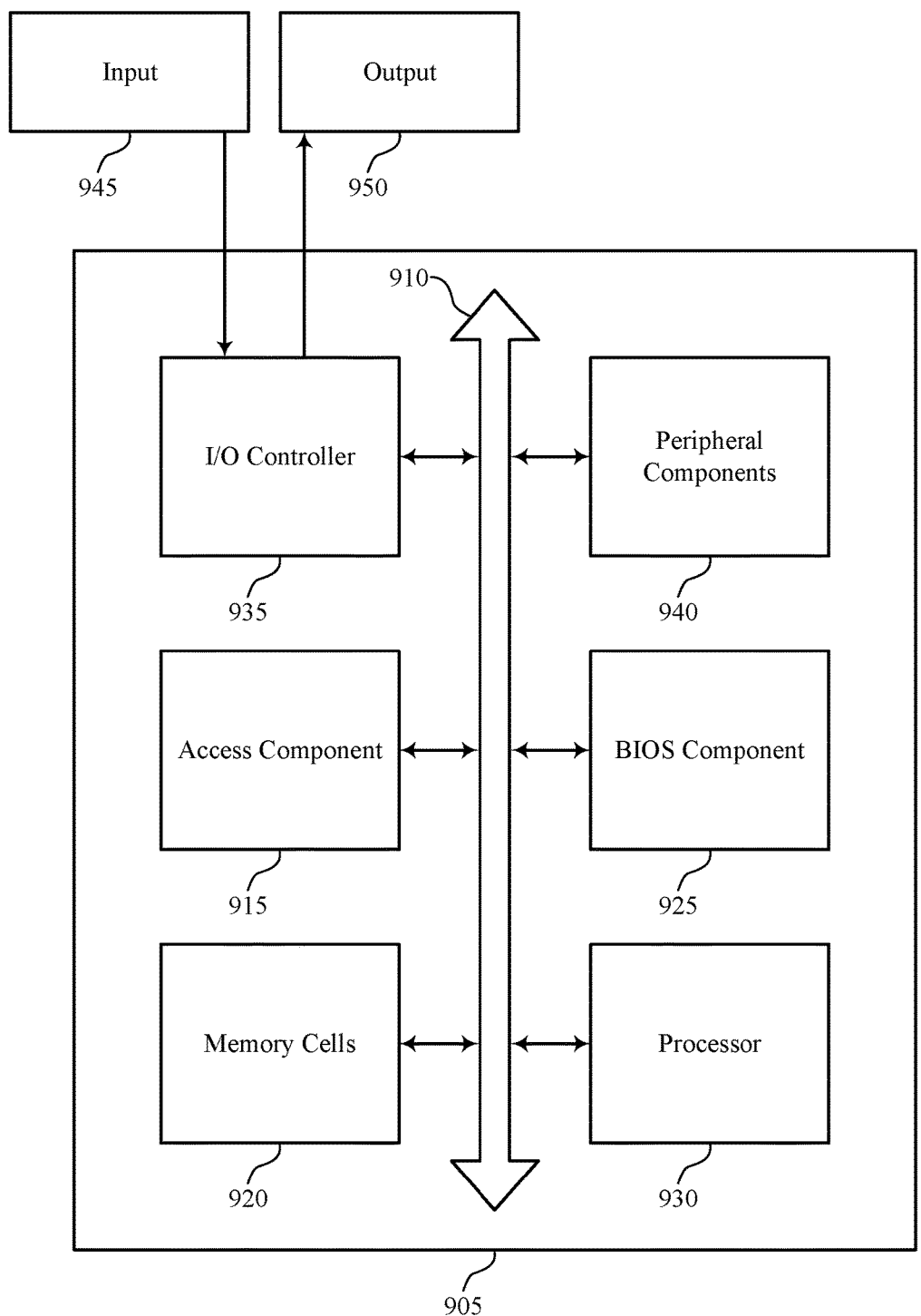
FIG. 9 illustrates a block diagram of a system including a memory device that supports techniques for accessing an array of memory cells in accordance with embodiments of the present disclosure.

FIG. 9 shows a diagram of a system 900 including a device 905 that supports techniques for accessing an array of memory cells in accordance with embodiments of the present disclosure. Device 905 may be an example of or include the components of memory device 100 as described above, e.g., with reference to FIG. 1. Device 905 may include components for bi-directional voice and data communications including components for transmitting and receiving communications, including access component 915, memory cells 920, basic input/output system (BIOS) component 925, processor 930, I/O controller 935, and peripheral components 940. These components may be in electronic communication via one or more buses (e.g., bus 910).

Memory cells 920 may store information (i.e., in the form of a logical state) as described herein.

BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting techniques for accessing an array of memory cells).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or aspect of such a device.

Figure 10:
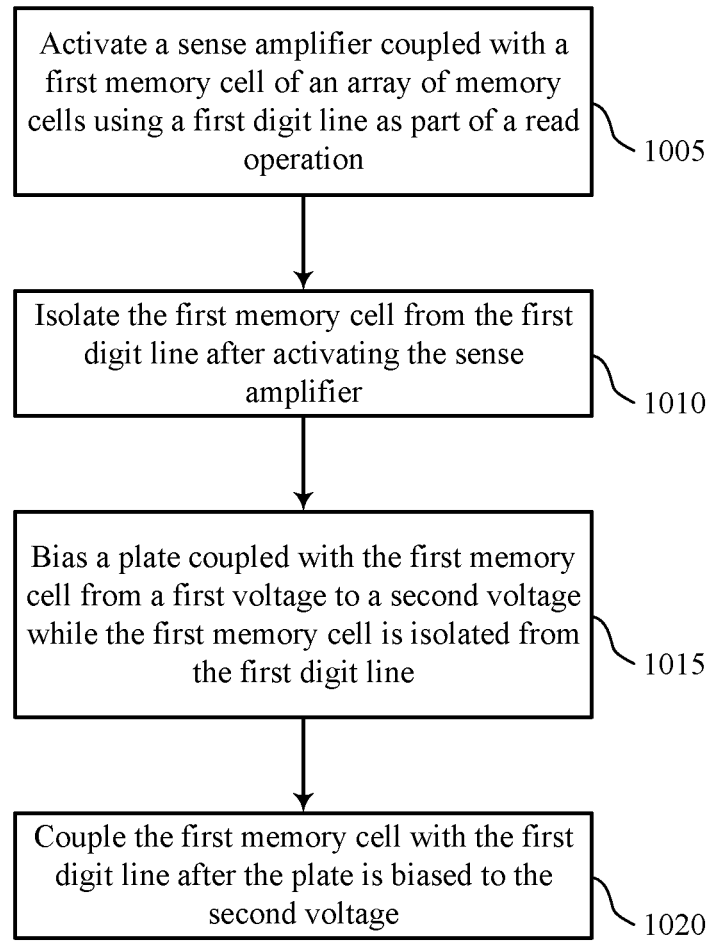
FIGS. 10 through 13 illustrate methods for accessing an array of memory cells in accordance with embodiments of the present disclosure.

FIG. 10 shows a flowchart illustrating a method 1000 for techniques for accessing an array of memory cells in accordance with embodiments of the present disclosure. The operations of method 1000 may be implemented by a memory device 100 or its components as described herein. For example, the operations of method 1000 may be performed by a access manager as described with reference to FIGS. 4 through 9. In some examples, a memory device 100 may execute a set of codes to control the functional elements of the device to perform the functions described below. Additionally or alternatively, the memory device 100 may perform aspects of the functions described below using special-purpose hardware.

At 1005 the memory device 100 may activate a sense amplifier coupled with a first memory cell of an array of memory cells using a first digit line as part of a read operation. The operations of 1005 may be performed according to the methods described herein. In certain examples, aspects of the operations of 1005 may be performed by a sense manager as described with reference to FIGS. 4 through 9.

At 1010 the memory device 100 may isolate the first memory cell from the first digit line after activating the sense amplifier. The operations of 1010 may be performed according to the methods described herein. In certain examples, aspects of the operations of 1010 may be performed by a connection manager as described with reference to FIGS. 7 through 9.

At 1015 the memory device 100 may bias a plate coupled with the first memory cell from a first voltage to a second voltage while the first memory cell is isolated from the first digit line. The operations of 1015 may be performed according to the methods described herein. In certain examples, aspects of the operations of 1015 may be performed by a plate transition manager as described with reference to FIGS. 4 through 9.

At 1020 the memory device 100 may couple the first memory cell with the first digit line after the plate is biased to the second voltage. The operations of 1020 may be performed according to the methods described herein. In certain examples, aspects of the operations of 1020 may be performed by a connection manager as described with reference to FIGS. 4 through 9.

An apparatus for performing the method 1000 is described. The apparatus may include means for activating a sense amplifier coupled with a first memory cell of an array of memory cells using a first digit line as part of a read operation, means for isolating the first memory cell from the first digit line after activating the sense amplifier, means for biasing a plate coupled with the first memory cell from a first voltage to a second voltage while the first memory cell is isolated from the first digit line, and means for coupling the first memory cell with the first digit line after the plate is biased to the second voltage.

Another apparatus for performing the method 1000 is described. The apparatus may include a memory cell and a memory controller in electronic communication with the memory cell, wherein the memory cell is operable to activate a sense amplifier coupled with a first memory cell of an array of memory cells using a first digit line as part of a read operation, isolate the first memory cell from the first digit line after activating the sense amplifier, bias a plate coupled with the first memory cell from a first voltage to a second voltage while the first memory cell is isolated from the first digit line, and couple the first memory cell with the first digit line after the plate is biased to the second voltage.

Some examples of the method 1000 and apparatus described above may further include processes, features, means, or instructions for biasing a second digit line that may be coupled with the plate to the second voltage after the first memory cell may be isolated from the first digit line. Some examples of the method 1000 and apparatus described above may further include processes, features, means, or instructions for coupling the second digit line with the plate, wherein biasing the plate and the second digit line may be based at least in part on coupling the second digit line with the plate. Some examples of the method 1000 and apparatus described above may further include processes, features, means, or instructions for coupling the first memory cell with the first digit line comprises activating a switching component coupled with the first memory cell and the first digit line.

Some examples of the method 1000 and apparatus described above may further include processes, features, means, or instructions for determining a transition time for biasing the plate from the first voltage to the second voltage based at least in part on isolating the first memory cell from the first digit line, wherein the transition time when the first memory cell may be isolated from the first digit line may be longer than a transition time for biasing the plate when the first memory cell may be coupled with the first digit line. In some examples of the method 1000 and apparatus described above, the first memory cell may be isolated from the first digit line during a duration that begins after activating the sense amplifier as part of the read operation and ends before a write-back operation may be initiated.

Some examples of the method 1000 and apparatus described above may further include processes, features, means, or instructions for isolating the first memory cell from the first digit line after a write-back operation may be complete. Some examples of the method 1000 and apparatus described above may further include processes, features, means, or instructions for biasing the plate to the second voltage from the first voltage based at least in part on isolating the first memory cell after the write-back operation.

Some examples of the method 1000 and apparatus described above may further include processes, features, means, or instructions for biasing the plate while the first memory cell may be isolated from the first digit line decouples the first digit line from the plate and mitigates a parasitic signal induced on the first digit line. Some examples of the method 1000 and apparatus described above may further include processes, features, means, or instructions for biasing the plate while the first memory cell may be isolated from the first digit line decouples the first digit line from the plate and mitigates a parasitic signal induced on a second memory cell coupled with the first digit line.

In some examples of the method 1000 and apparatus described above, the parasitic signal may be a charge accumulation on a cell bottom of the second memory cell. Some examples of the method 1000 and apparatus described above may further include processes, features, means, or instructions for biasing the plate while the first memory cell may be isolated from the first digit line decouples the first digit line from the plate and mitigates a parasitic signal induced on a second word line. In some examples of the method 1000 and apparatus described above, the plate may be coupled with memory cells of an array of memory cells that may be coupled with the first digit line and one or more unselected digit lines. In some examples of the method 1000 and apparatus described above, the plate may be coupled with multiple rows or multiple columns of memory cells of a first deck and with multiple rows or multiple columns of memory cells of a second deck. In some examples of the method 1000 and apparatus described above, the first memory cell may be a ferroelectric memory cell.

Figure 11:
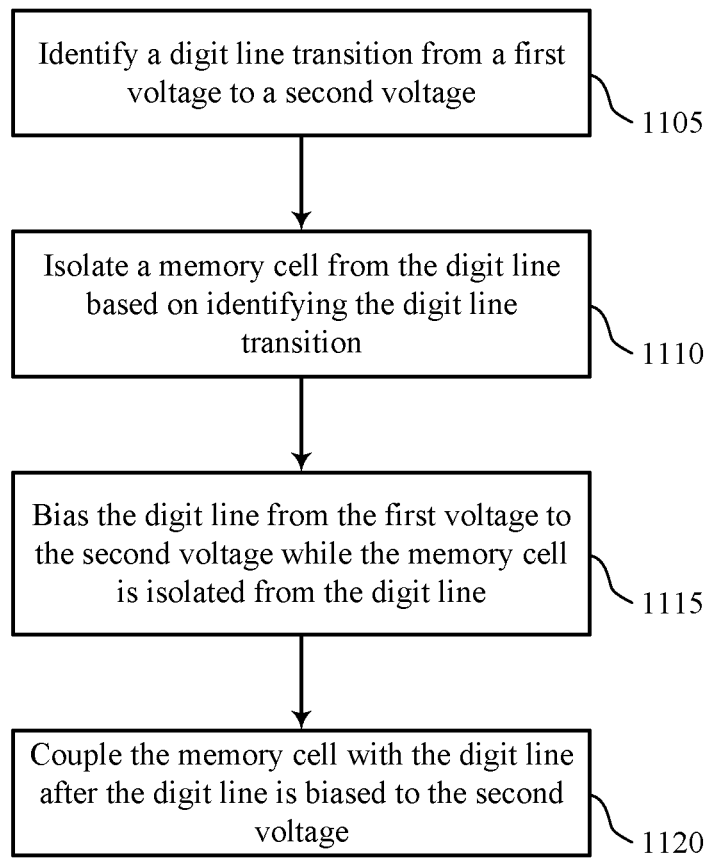

FIG. 11 shows a flowchart illustrating a method 1100 for techniques for accessing an array of memory cells in accordance with embodiments of the present disclosure. The operations of method 1100 may be implemented by a memory device 100 or its components as described herein. For example, the operations of method 1100 may be performed by a access manager as described with reference to FIGS. 4 through 9. In some examples, a memory device 100 may execute a set of codes to control the functional elements of the device to perform the functions described below. Additionally or alternatively, the memory device 100 may perform aspects of the functions described below using special-purpose hardware.

At 1105 the memory device 100 may identify a digit line transition from a first voltage to a second voltage. The operations of 1105 may be performed according to the methods described herein. In certain examples, aspects of the operations of 1105 may be performed by a transition manager as described with reference to FIGS. 4 through 9.

At 1110 the memory device 100 may isolate a memory cell from the digit line based at least in part on identifying the digit line transition. The operations of 1110 may be performed according to the methods described herein. In certain examples, aspects of the operations of 1110 may be performed by a connection manager as described with reference to FIGS. 4 through 9.

At 1115 the memory device 100 may bias the digit line from the first voltage to the second voltage while the memory cell is isolated from the digit line. The operations of 1115 may be performed according to the methods described herein. In certain examples, aspects of the operations of 1115 may be performed by a transition manager as described with reference to FIGS. 4 through 9.

At 1120 the memory device 100 may couple the memory cell with the digit line after the digit line is biased to the second voltage. The operations of 1120 may be performed according to the methods described herein. In certain examples, aspects of the operations of 1120 may be performed by a connection manager as described with reference to FIGS. 4 through 9.

An apparatus for performing the method 1100 is described. The apparatus may include means for identifying a digit line transition from a first voltage to a second voltage, means for isolating a memory cell from the digit line based at least in part on identifying the digit line transition, means for biasing the digit line from the first voltage to the second voltage while the memory cell is isolated from the digit line, and means for coupling the memory cell with the digit line after the digit line is biased to the second voltage.

Another apparatus for performing the method 1100 is described. The apparatus may include a memory cell and a memory controller in electronic communication with the memory cell, wherein the memory cell is operable to identify a digit line transition from a first voltage to a second voltage, isolate a memory cell from the digit line based at least in part on identifying the digit line transition, bias the digit line from the first voltage to the second voltage while the memory cell is isolated from the digit line, and couple the memory cell with the digit line after the digit line is biased to the second voltage.

Some examples of the method 1100 and apparatus described above may further include processes, features, means, or instructions for performing a write-back operation after coupling the memory cell with the digit line. Some examples of the method 1100 and apparatus described above may further include processes, features, means, or instructions for biasing the digit line while the memory cell may be isolated from the digit line decouples the digit line from the plate and mitigates a parasitic signal induced on an unselected memory cell.

Some examples of the method 1100 and apparatus described above may further include processes, features, means, or instructions for identifying a start time of the digit line transition. Some examples of the method 1100 and apparatus described above may further include processes, features, means, or instructions for identifying an isolation duration associated with the memory cell based at least in part on identifying the start time, and isolating the memory cell based at least in part on the isolation duration and the start time.

Some examples of the method 1100 and apparatus described above may further include processes, features, means, or instructions for identifying a second digit line transition back from the second voltage to the first voltage, the second digit line transition occurring after a write-back operation may be complete. Some examples of the method 1100 and apparatus described above may further include processes, features, means, or instructions for isolating the memory cell from the digit line based at least in part on identifying the second digit line transition. Some examples of the method 1100 and apparatus described above may further include processes, features, means, or instructions for biasing the digit line from the second voltage to the first voltage while the memory cell may be isolated from the digit line. Some examples of the method 1100 and apparatus described above may further include processes, features, means, or instructions for coupling the memory cell with the digit line based at least in part on the digit line being biased to the first voltage.

Figure 12:
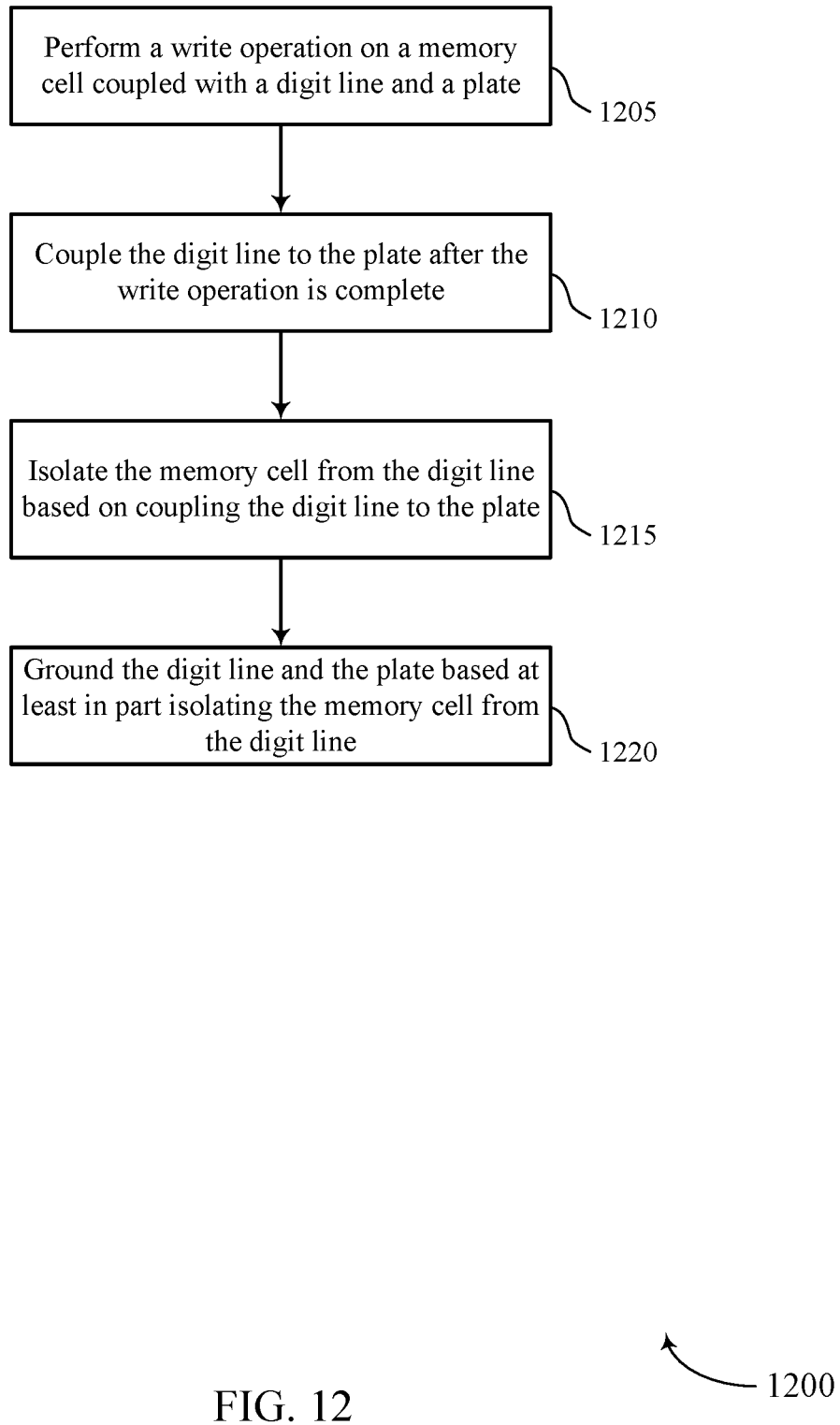

FIG. 12 shows a flowchart illustrating a method 1200 for techniques for accessing an array of memory cells in accordance with embodiments of the present disclosure. The operations of method 1200 may be implemented by a memory device 100 or its components as described herein. For example, the operations of method 1200 may be performed by a access manager as described with reference to FIGS. 4 through 9. In some examples, a memory device 100 may execute a set of codes to control the functional elements of the device to perform the functions described below. Additionally or alternatively, the memory device 100 may perform aspects of the functions described below using special-purpose hardware.

At 1205 the memory device 100 may perform a write operation on a memory cell coupled with a digit line and a plate. The operations of 1205 may be performed according to the methods described herein. In certain examples, aspects of the operations of 1205 may be performed by a write manager as described with reference to FIGS. 4 through 9.

At 1210 the memory device 100 may couple the digit line to the plate after the write operation is complete. The operations of 1210 may be performed according to the methods described herein. In certain examples, aspects of the operations of 1210 may be performed by a connection manager as described with reference to FIGS. 4 through 9.

At 1215 the memory device 100 may isolate the memory cell from the digit line based at least in part on coupling the digit line to the plate. The operations of 1215 may be performed according to the methods described herein. In certain examples, aspects of the operations of 1215 may be performed by a connection manager as described with reference to FIGS. 4 through 9.

At 1220 the memory device 100 may ground the digit line and the plate based at least in part isolating the memory cell from the digit line. The operations of 1220 may be performed according to the methods described herein. In certain examples, aspects of the operations of 1220 may be performed by a connection manager as described with reference to FIGS. 4 through 9.

An apparatus for performing the method 1200 is described. The apparatus may include means for performing a write operation on a memory cell coupled with a digit line and a plate, means for coupling the digit line to the plate after the write operation is complete, means for isolating the memory cell from the digit line based at least in part on coupling the digit line to the plate, and means for grounding the digit line and the plate based at least in part isolating the memory cell from the digit line.

Another apparatus for performing the method 1200 is described. The apparatus may include a memory cell and a memory controller in electronic communication with the memory cell, wherein the memory cell is operable to perform a write operation on a memory cell coupled with a digit line and a plate, couple the digit line to the plate after the write operation is complete, isolate the memory cell from the digit line based at least in part on coupling the digit line to the plate, and ground the digit line and the plate based at least in part isolating the memory cell from the digit line.

Some examples of the method 1200 and apparatus described above may further include processes, features, means, or instructions for coupling an unselected digit line with the plate after the write operation may be complete, wherein the unselected digit line may be coupled with memory cells that may be coupled with the plate. Some examples of the method 1200 and apparatus described above may further include processes, features, means, or instructions for grounding the unselected digit line based at least in part isolating the memory cell from the digit line.

Some examples of the method 1200 and apparatus described above may further include processes, features, means, or instructions for initiating a precharge operation based at least in part on coupling the digit line to the plate after the write operation may be complete. In some examples of the method 1200 and apparatus described above, the plate comprises a sheet coupled with multiple rows or multiple columns of memory cells.

Figure 13:
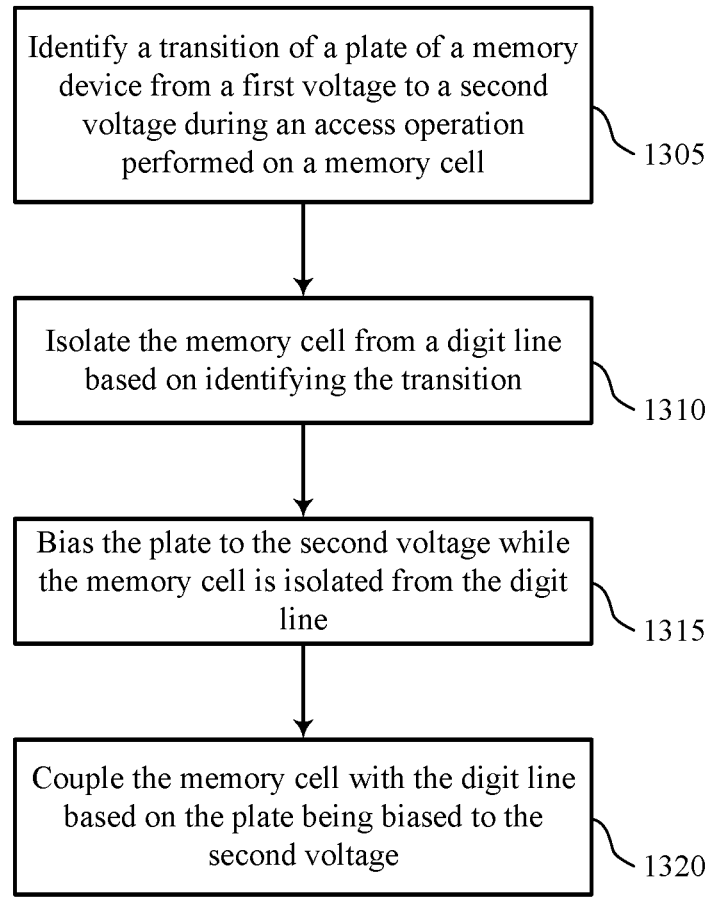

FIG. 13 shows a flowchart illustrating a method 1300 for techniques for accessing an array of memory cells in accordance with embodiments of the present disclosure. The operations of method 1300 may be implemented by a memory device 100 or its components as described herein. For example, the operations of method 1300 may be performed by a access manager as described with reference to FIGS. 4 through 9. In some examples, a memory device 100 may execute a set of codes to control the functional elements of the device to perform the functions described below. Additionally or alternatively, the memory device 100 may perform aspects of the functions described below using special-purpose hardware.

At 1305 the memory device 100 may identify a transition of a plate of a memory device from a first voltage to a second voltage during an access operation performed on a memory cell. The operations of 1305 may be performed according to the methods described herein. In certain examples, aspects of the operations of 1305 may be performed by a transition manager as described with reference to FIGS. 4 through 9.

At 1310 the memory device 100 may isolate the memory cell from a digit line based at least in part on identifying the transition. The operations of 1310 may be performed according to the methods described herein. In certain examples, aspects of the operations of 1310 may be performed by a connection manager as described with reference to FIGS. 4 through 9.

At 1315 the memory device 100 may bias the plate to the second voltage while the memory cell is isolated from the digit line. The operations of 1315 may be performed according to the methods described herein. In certain examples, aspects of the operations of 1315 may be performed by a connection manager as described with reference to FIGS. 4 through 9.

At 1320 the memory device 100 may couple the memory cell with the digit line based at least in part on the plate being biased to the second voltage. The operations of 1320 may be performed according to the methods described herein. In certain examples, aspects of the operations of 1320 may be performed by a connection manager as described with reference to FIGS. 4 through 9.

An apparatus for performing the method 1300 is described. The apparatus may include means for identifying a transition of a plate of a memory device from a first voltage to a second voltage during an access operation performed on a memory cell, means for isolating the memory cell from a digit line based at least in part on identifying the transition, means for biasing the plate to the second voltage while the memory cell is isolated from the digit line, and means for coupling the memory cell with the digit line based at least in part on the plate being biased to the second voltage.

Another apparatus for performing the method 1300 is described. The apparatus may include a memory cell and a memory controller in electronic communication with the memory cell, wherein the memory cell is operable to identify a transition of a plate of a memory device from a first voltage to a second voltage during an access operation performed on a memory cell, isolate the memory cell from a digit line based at least in part on identifying the transition, bias the plate to the second voltage while the memory cell is isolated from the digit line, and couple the memory cell with the digit line based at least in part on the plate being biased to the second voltage.

Some examples of the method 1300 and apparatus described above may further include processes, features, means, or instructions for isolating the memory cell from the digit line may be performed for at least one transition of the plate that occurs during the access operation performed on the memory cell.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
activating a sense amplifier coupled with a first memory cell of an array of memory cells using a first digit line as part of a read operation;
isolating the first memory cell from the first digit line after activating the sense amplifier, wherein the first memory cell is isolated from the first digit line during a duration that begins after activating the sense amplifier as part of the read operation and ends before a write-back operation is initiated;
biasing a plate coupled with the first memory cell from a first voltage to a second voltage while the first memory cell is isolated from the first digit line; and
coupling the first memory cell with the first digit line after the plate is biased to the second voltage.

2. The method of claim 1, further comprising:
biasing a second digit line that is coupled with the plate to the second voltage after the first memory cell is isolated from the first digit line.

3. The method of claim 2, further comprising:
coupling the second digit line with the plate, wherein biasing the plate and the second digit line are based at least in part on coupling the second digit line with the plate.

4. The method of claim 1, wherein coupling the first memory cell with the first digit line comprises activating a switching component coupled with the first memory cell and the first digit line.

5. The method of claim 1, further comprising:
determining a transition time for biasing the plate from the first voltage to the second voltage based at least in part on isolating the first memory cell from the first digit line, wherein the transition time when the first memory cell is isolated from the first digit line is longer than a transition time for biasing the plate when the first memory cell is coupled with the first digit line.

6. The method of claim 1, further comprising:
isolating the first memory cell from the first digit line after the write-back operation is complete; and biasing the plate to the second voltage from the first voltage based at least in part on isolating the first memory cell after the write-back operation.

7. The method of claim 1, wherein the plate is coupled with memory cells of the array of memory cells that are coupled with the first digit line and one or more unselected digit lines.

8. The method of claim 1, wherein the plate is coupled with multiple rows or multiple columns of memory cells of a first deck and with multiple rows or multiple columns of memory cells of a second deck.

9. The method of claim 1, wherein the first memory cell is a ferroelectric memory cell.

10. A method comprising,
activating a sense amplifier coupled with a first memory cell of an array of memory cells using a first digit line as part of a read operation;
isolating the first memory cell from the first digit line after activating the sense amplifier;
biasing a plate coupled with the first memory cell from a first voltage to a second voltage while the first memory cell is isolated from the first digit line, wherein biasing the plate while the first memory cell is isolated from the first digit line decouples the first digit line from the plate and mitigates a parasitic signal induced on the first digit line; and
coupling the first memory cell with the first digit line after the plate is biased to the second voltage.

11. The method of claim 10, further comprising:
biasing a second digit line that is coupled with the plate to the second voltage after the first memory cell is isolated from the first digit line.

12. The method of claim 11, further comprising:
coupling the second digit line with the plate, wherein biasing the plate and the second digit line are based at least in part on coupling the second digit line with the plate.

13. The method of claim 10, further comprising:
determining a transition time for biasing the plate from the first voltage to the second voltage based at least in part on isolating the first memory cell from the first digit line, wherein the transition time when the first memory cell is isolated from the first digit line is longer than a transition time for biasing the plate when the first memory cell is coupled with the first digit line.

14. The method of claim 10, further comprising:
isolating the first memory cell from the first digit line after a write-back operation is complete; and
biasing the plate to the second voltage from the first voltage based at least in part on isolating the first memory cell after the write-back operation.

15. A method comprising,
activating a sense amplifier coupled with a first memory cell of an array of memory cells using a first digit line as part of a read operation;
isolating the first memory cell from the first digit line after activating the sense amplifier;
biasing a plate coupled with the first memory cell from a first voltage to a second voltage while the first memory cell is isolated from the first digit line, wherein biasing the plate while the first memory cell is isolated from the first digit line decouples the first digit line from the plate and mitigates a parasitic signal induced on a second memory cell coupled with the first digit line; and
coupling the first memory cell with the first digit line after the plate is biased to the second voltage.

16. The method of claim 15, wherein the parasitic signal is a charge accumulation on a cell bottom of the second memory cell.

17. The method of claim 15, further comprising:
biasing a second digit line that is coupled with the plate to the second voltage after the first memory cell is isolated from the first digit line.

18. The method of claim 17, further comprising:
coupling the second digit line with the plate, wherein biasing the plate and the second digit line are based at least in part on coupling the second digit line with the plate.

19. The method of claim 15, wherein coupling the first memory cell with the first digit line comprises activating a switching component coupled with the first memory cell and the first digit line.

20. The method of claim 15, further comprising:
determining a transition time for biasing the plate from the first voltage to the second voltage based at least in part on isolating the first memory cell from the first digit line, wherein the transition time when the first memory cell is isolated from the first digit line is longer than a transition time for biasing the plate when the first memory cell is coupled with the first digit line.

21. The method of claim 15, further comprising:
isolating the first memory cell from the first digit line after a write-back operation is complete; and
biasing the plate to the second voltage from the first voltage based at least in part on isolating the first memory cell after the write-back operation.

22. A method comprising,
activating a sense amplifier coupled with a first memory cell of an array of memory cells using a first digit line as part of a read operation;
isolating the first memory cell from the first digit line after activating the sense amplifier;
biasing a plate coupled with the first memory cell from a first voltage to a second voltage while the first memory cell is isolated from the first digit line, wherein biasing the plate while the first memory cell is isolated from the first digit line decouples the first digit line from the plate and mitigates a parasitic signal induced on a second word line; and
coupling the first memory cell with the first digit line after the plate is biased to the second voltage.

23. The method of claim 22, further comprising:
biasing a second digit line that is coupled with the plate to the second voltage after the first memory cell is isolated from the first digit line.

24. The method of claim 23, further comprising:
coupling the second digit line with the plate, wherein biasing the plate and the second digit line are based at least in part on coupling the second digit line with the plate.

25. The method of claim 22, wherein coupling the first memory cell with the first digit line comprises activating a switching component coupled with the first memory cell and the first digit line.

* * * * *